US012749531B1

(12) United States Patent
Nazarian

(10) Patent No.: US 12,749,531 B1
(45) Date of Patent: Sep. 29, 2026

(54) WORDLINE-COUPLED DIFFERENTIAL PROGRAMMING OF TWO-TERMINAL MEMORY WITH INCREASED CELL DENSITY AND CONSISTENT CELL PITCH

(71) Applicant: Crossbar, Inc., Santa Clara, CA (US)

(72) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 308 days.

(21) Appl. No.: 18/135,016

(22) Filed: Apr. 14, 2023

(51) Int. Cl.
*G11C 13/00* (2006.01)
*H10B 63/00* (2023.01)

(52) U.S. Cl.
CPC ...... *G11C 13/0059* (2013.01); *G11C 13/0028* (2013.01); *G11C 13/0069* (2013.01); *H10B 63/30* (2023.02)

(58) Field of Classification Search
CPC ............ G11C 13/0059; G11C 13/0028; G11C 13/0069; H10B 63/30
See application file for complete search history.

(56) References Cited

U.S. PATENT DOCUMENTS

| | | | |
|---|---|---|---|
| 7,006,373 | B2 | 2/2006 | Hidaka |
| 7,672,155 | B2 | 3/2010 | Kim et al. |
| 9,520,173 | B1 | 12/2016 | Baker, Jr. et al. |
| 10,692,575 | B1 | 6/2020 | Huang |
| 2007/0058425 | A1 | 3/2007 | Cho et al. |
| 2007/0247940 | A1 | 10/2007 | Liaw et al. |
| 2008/0137436 | A1 | 6/2008 | Salter |
| 2011/0299340 | A1 | 12/2011 | Samachisa et al. |
| 2011/0317481 | A1* | 12/2011 | Franceschini ...... G11C 13/0069 716/136 |
| 2014/0268994 | A1 | 9/2014 | Rose et al. |

(Continued)

FOREIGN PATENT DOCUMENTS

| | | |
|---|---|---|
| CN | 114187945 A | 3/2022 |

OTHER PUBLICATIONS

Ex Parte Quayle action for U.S. Appl. No. 17/710,858, dated Jan. 31, 2024,Oct. 3, 2023, 8 pages long.
Notice of Allowance for U.S. Appl. No. 17/710,858, dated Jan. 31, 2024, 8 pages long.

(Continued)

*Primary Examiner* — Alexander Sofocleous
*Assistant Examiner* — Joseph Fidelis Stormes
(74) *Attorney, Agent, or Firm* — Wegman Hessler

(57) ABSTRACT

An architecture is provided for differential programming of multiple one-resistor, one-transistor (1T1R) two-terminal resistive switching memory cells that define a single bit (e.g., a differential bit). The single bit can be a physical unclonable function (PUF) bit or a random number generation (RNG) bit, or the like. A program voltage can be applied concurrently to the multiple 1T1R cells on a common bitline, and a pass transistor activated to electrically short second terminals of the two-terminal resistive switching memory cells. As a result, programming of one of the multiple memory cells can intrinsically and very rapidly suppress programming of remaining memory cells of the differential bit, and greatly mitigate or avoid an invalid data result. In addition, two-terminal resistive switching memory cells of the architecture can have uniform or substantially uniform pitch there between, increasing cell density and minimizing or avoiding process and electrical variation among such memory cells.

19 Claims, 13 Drawing Sheets

SINGLE BITLINE DIFFERENTIAL ReMEM ARRAY CIRCUIT WITH COMMON ReMEM PITCH
300

(56) References Cited

U.S. PATENT DOCUMENTS

| | | | | |
|---|---|---|---|---|
| 2014/0321193 | A1 | 10/2014 | Park | |
| 2016/0133325 | A1 | 5/2016 | Lan et al. | |
| 2016/0284403 | A1 | 9/2016 | Navon et al. | |
| 2017/0345496 | A1* | 11/2017 | Liu | G11C 13/0026 |
| 2018/0151224 | A1* | 5/2018 | Chih | G11C 13/0059 |
| 2019/0287612 | A1 | 9/2019 | Jin et al. | |
| 2019/0341107 | A1 | 11/2019 | Bertin | |
| 2021/0201997 | A1 | 7/2021 | Yuh et al. | |
| 2022/0036949 | A1 | 2/2022 | Asnaashari et al. | |
| 2022/0084592 | A1 | 3/2022 | Tamara | |
| 2022/0375536 | A1 | 11/2022 | Strachan et al. | |
| 2023/0100181 | A1* | 3/2023 | Jiang | G11C 11/161<br>365/158 |
| 2023/0138195 | A1 | 5/2023 | Park et al. | |

OTHER PUBLICATIONS

International Search Report and Written Opinion for International Application No. PCT/US2023/065178 dated Jul. 24, 2023, 7 pages.

Notice of Allowance for U.S. Appl. No. 18/587,443, dated Dec. 2, 2024, 13 pages long.

Notice of Allowance for U.S. Appl. No. 17/710,835, dated Apr. 9, 2024, 10 pages long.

Office Action for U.S. Appl. No. 17/895,129, dated Apr. 26, 2024, 16 pages long.

Notice of Allowance for U.S. Appl. No. 17/710,809, dated May 24, 2024, 19 pages long.

Notice of Allowance for U.S. Appl. No. 17/710,835 dated Oct. 18, 2023, 8 pages long.

Notice of Allowance for U.S. Appl. No. 17/710,858, dated Aug. 1, 2024, 15 pages long.

* cited by examiner

SINGLE BITLINE DIFFERENTIAL ReMEM ARRAY CIRCUIT WITH COMMON ReMEM PITCH
300

WORDLINE-COUPLED DIFFERENTIAL PUF PROGRAM EVENT
600

SINGLE BITLINE DIFFERENTIAL ReMEM WITH COMMON PITCH
900

WORDLINE-COUPLED DIFFERENTIAL PROGRAMMING OF TWO-TERMINAL MEMORY WITH INCREASED CELL DENSITY AND CONSISTENT CELL PITCH

INCORPORATION BY REFERENCE

U.S. patent application Ser. No. 17/895,129 filed Aug. 25, 2022 and titled "DIFFERENTIAL PROGRAMMING OF TWO-TERMINAL MEMORY WITH INTRINSIC ERROR SUPPRESSION AND WORDLINE COUPLING", U.S. patent application Ser. No. 17/710,809 filed Mar. 31, 2022 and titled "DIFFERENTIAL PROGRAMMING OF TWO-TERMINAL RESISTIVE SWITCHING MEMORY WITH INTRINSIC ERROR SUPPRESSION", and U.S. patent application Ser. No. 17/223,817 filed Apr. 6, 2021 and titled DISTINCT CHIP IDENTIFIER SEQUENCE UTILIZING UNCLONABLE CHARACTERISTICS OF RESISTIVE MEMORY ON A CHIP, are hereby incorporated by reference herein in their respective entireties and for all purposes.

TECHNICAL FIELD

The subject disclosure relates generally to two-terminal memory devices, and as one illustrative example, physical unclonable function differential programming of multiple two-terminal memory cells connected by a wordline.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

In addition to memory elements, volatile resistive-switching elements have been proposed in conjunction with a MOS transistor for a high-speed non-volatile memory device, or as a high-speed field actuated switch, or selector device. Still further, stochastic characteristics of resistive-switching structures have been proposed by the inventor as suitable for generating non-correlated data for random number generation, or similar applications. Each of these applications has met different needs for electronic memory applications or specialty data generation applications.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide an architecture for differential programming of multiple one-resistor, one-transistor (1T1R) two-terminal resistive switching memory cells that define a single bit. In an embodiment(s), the single bit can be an identifier bit such as a physical unclonable function (PUF) bit or a random number generation (RNG) bit, or the like. The disclosed differential programming can apply a program cycle on a bitline coupled to multiple memory cells, and electrically short second terminals of the multiple memory cells by a wordline-activated switch. Programming of one of the multiple memory cells to a low resistance state can intrinsically and very rapidly suppress programming of remaining memory cells of an identifier bit, and greatly mitigate or avoid an invalid data result thereof. In addition, two-terminal resistive switching memory cells overlying a diffusion layer on which the transistors and wordline switch reside can have uniform or substantially uniform pitch, increasing cell density of a two-terminal resistive switching memory array and minimizing or avoiding process and electrical variation among such memory cells.

In various embodiments of the present specification, disclosed is an integrated circuit device comprising an array of transistors, an array of two-terminal resistive switching memory (ReMEM) cells, and a bitline. A first group of transistors of the array of transistors and a first group of ReMEM cells of the array of ReMEM cells can form a first plurality of one transistor one resistive memory (1T1R) ReMEM circuits coupled respectively at one end to the bitline and at a second end to ground. Further, a second group of transistors of the array of transistors and a second group of ReMEM cells of the array of ReMEM cells can form a second plurality of 1T1R ReMEM circuits coupled respectively at one end to the bitline and at a second end to ground. In further embodiments, the integrated circuit device can comprise a first wordline coupled to a gate of a first transistor of a first 1T1R ReMEM circuit of the first plurality of 1T1R ReMEM circuits, where the first 1T1R ReMEM circuit can comprise the first transistor and the first two-terminal ReMEM of the first group of ReMEM cells. In addition, the integrated circuit device can comprise a second wordline coupled to a second gate of a second transistor of a second 1T1R ReMEM circuit of the first plurality of 1T1R ReMEM circuits, where the second 1T1R ReMEM circuit can comprise the second transistor and a second two-terminal ReMEM of the first group of ReMEM cells. In some embodiments, the integrated circuit device can comprise a pass transistor of the first group of transistors. The pass transistor can be coupled at a source node thereof to a first common node of the first 1T1R ReMEM circuit that electrically couples a second terminal of the first two-terminal ReMEM with a channel node of the first transistor. In addition, the pass transistor can be coupled at a drain node thereof to a second common node of the second 1T1R ReMEM circuit that electrically couples a second terminal of the second two-terminal ReMEM with a second channel node of the second transistor. The integrated circuit device can further comprise a pass wordline coupled to a gate node of the pass transistor, where activation of the pass wordline electrically shorts the first common node and the second common node through the pass transistor.

In another aspect of the present disclosure, provided is a semiconductor chip. The semiconductor chip can comprise an array of transistors formed in a diffusion layer of the semiconductor chip, an array of two-terminal memory cells overlying the diffusion layer and overlying at least a portion of the array of transistors and a bitline. The semiconductor chip can further comprise a first group of wordlines and a first 1T1R ReMEM circuit comprising one transistor of the array of transistors and one two-terminal memory cell of the array of two-terminal memory cells and a second 1T1R ReMEM circuit comprising a second transistor of the array of transistors and a second two-terminal memory cell of the array of two-terminal memory cells. In various embodiments, the first and second 1T1R ReMEM circuits can be coupled to respective wordlines of the first group of wordlines and form a differential programmed physical unclonable feature (PUF) non-volatile memory circuit coupled to the bitline. Still further, the semiconductor chip can comprise a second group of wordlines, a third 1T1R ReMEM circuit comprising a third transistor coupled to a third wordline of the second group of wordlines and a fourth 1T1R ReMEM circuit comprising a fourth transistor coupled to a fourth wordline of the second group of wordlines. Moreover, in one or more aspects of the disclosed embodiments, the third 1T1R ReMEM circuit or the fourth 1T1R ReMEM circuit can form a many-time programmable non-volatile memory circuit or a one-time programmable non-volatile memory circuit coupled to the bitline.

In still further aspects of the disclosed embodiments, provided is a method of fabricating a memory array of an integrated circuit. The method can comprise forming a set of transistors in a diffusion layer of a substrate and forming a set of resistive memory cells (ReMEM cells) at least in part overlying the set of transistors and the diffusion layer. In at least some disclosed embodiments, a first group of the ReMEM cells in a first portion of the set of ReMEM cells can have a first intercell pitch and a second group of the ReMEM cells in a second portion of the set of ReMEM cells can have a second intercell pitch equal to or substantially equal to the first intercell pitch. Further, the method can comprise coupling first terminals of a first group of the ReMEM cells to a bitline and respective second terminals of the first group of ReMEM cells to respective transistors of a first portion of the set of transistors, and can comprise configuring the first group of the ReMEM cells for many-time program (MTP) or one-time program (OTP) operation. In addition to the foregoing, the method can comprise coupling a first terminal of a first ReMEM cell of a second group of the ReMEM cells to the bitline and a second terminal of the first ReMEM cell to a first transistor of a second portion of the set of transistors to form a first 1T1R memory circuit, and can comprise coupling a first terminal of a second ReMEM cell of the second group of the ReMEM cells to the bitline and a second terminal of the second ReMEM cell to a second transistor of the second portion of the set of transistors to form a second 1T1R memory circuit. Still further, the method can comprise configuring the second group of the ReMEM cells for differential physical unclonable function (PUF) operation. According to one or more embodiments, configuring the second group of ReMEM cells can comprise coupling the first ReMEM cell and the second ReMEM cell to a pass transistor and coupling a pass wordline to a gate node of the pass transistor.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

FIG. 7 depicts a schematic diagram of an example array of ReMEM cells including a pair of cells forming a differential PUF circuit and a ReMEM cell there between.

DETAILED DESCRIPTION

Introduction

Figure 1:
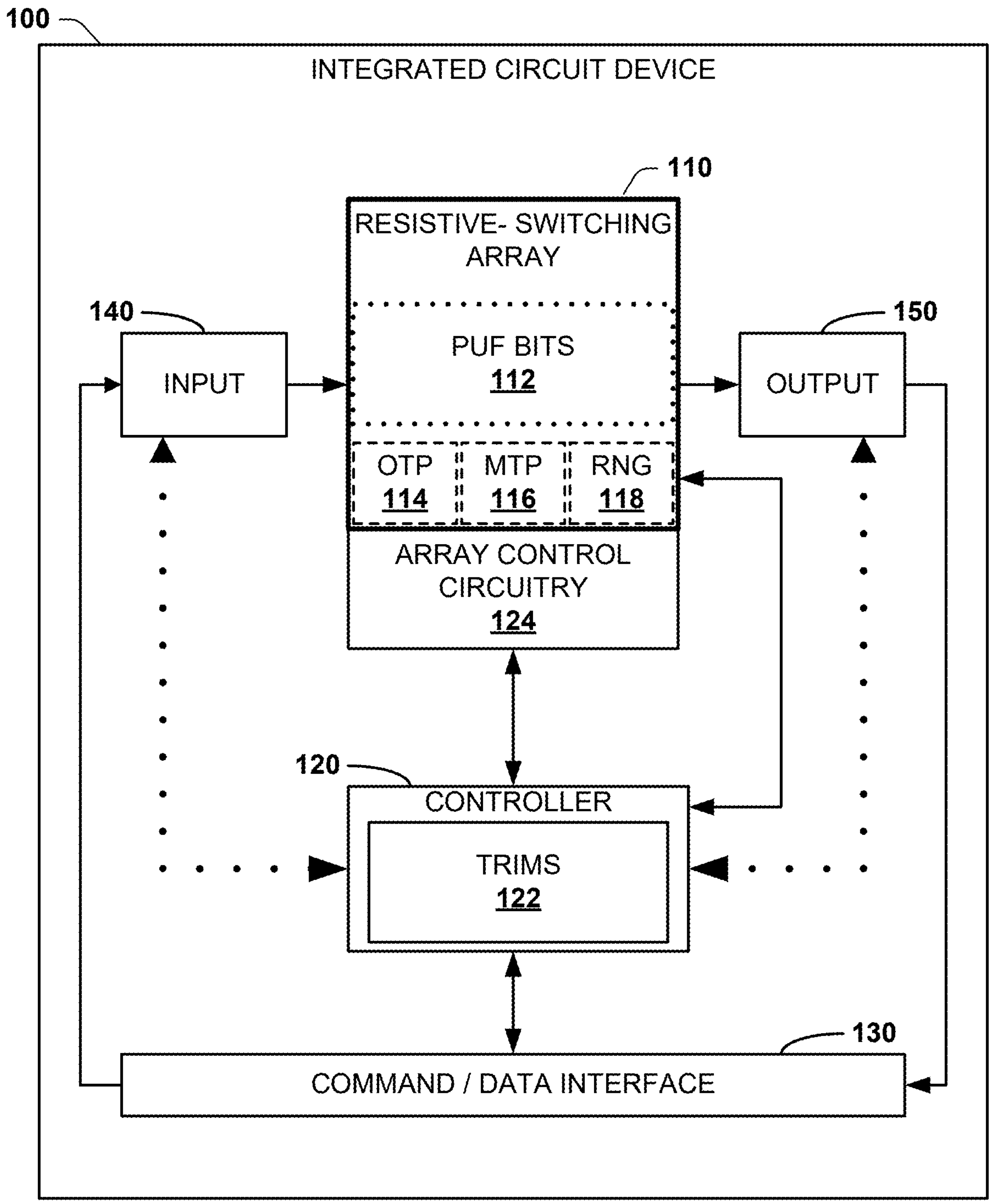
FIG. 1 depicts a block diagram of an example integrated circuit device and array of two-terminal resistive memory (ReMEM) for differential programming, in an embodiment(s).

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among a population of such devices. As a result, that data can be suited to applications requiring distinct or unique identification, such as identification and authorization applications pertaining to a device (e.g., a semiconductor die or chip, a semiconductor wafer, group(s) of dies, group(s) of wafers, an electronic device incorporating a semiconductor die(s), and so forth). Further, highly non-correlated data can also be utilized for security applications, such as random number generation, cryptographic key generation and verification applications, and the like.

Integrated circuit techniques for fabricating resistive switching devices, such as resistive switching memory devices, can cause physical properties having the stochastic or substantially stochastic characteristics desired for generating physical unclonable function (PUF) data. For instance, these physical properties can have little or no replication or repetition among a group of memory cells fabricated as part of the same process. As one example, one or more layers of a disclosed resistive switching device can have a root mean square (RMS) surface roughness of >0.2 nm, up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching device properties among cells such as: native or virgin (e.g., as fabricated) current conductance, native program voltage, differential program voltage, program speed, differential program speed, differential program event (e.g., see FIG. 3, infra, among others), as well as further properties disclosed throughout this specification, incorporated herein by reference, or known in the art. Processes disclosed herein for forming resistive switching devices or for leveraging stochastic or substantially stochastic physically unclonable features of resistive switching devices to model physical unclonable functions can provide excellent non-correlated data sequences.

In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve suitable stochastic physical characteristics. In other embodiments, a 22 nm photolithographic process producing a device size between 40 nm and 100 nm width (e.g., about 44 nm width, about 60 nm width, about 66 nm width, about 88 nm width, and so forth) can achieve suitable stochastic physical characteristics.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIG. 1, infra), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

More generally, stochastic physical characteristics can also be referred to as physical unclonable functions (PUF), physically unclonable features (also PUF), physical(ly) unclonable features, or other suitable nomenclature. Data derived from such stochastic physical characteristics are referred to herein as PUF data (or a PUF bit, or group of PUF bits, etc.) and generally involve a resistive switching cell process applied to one or more resistive switching cells that define a PUF bit(s) (e.g., see U.S. patent application Ser. No. 17/223,817 filed Apr. 6, 2021, incorporated by reference hereinabove). PUF data can be generated from a cell process(es) applied to native resistive switching memory cells (sometimes referred to as virgin resistive switching memory cells) that have not had a memory process (optionally excepting a forming process) previously applied to those memory cells, following manufacture. Example memory processes can include the forming process (e.g., comprising one or more electrical forming pulses), a program process (e.g., comprising one or more electrical program pulses), an erase process (e.g., comprising one or more electrical erase pulses), an overwrite process, and so forth. In addition, PUF data generated from non-volatile resistive switching memory cells can thereafter be stored and read from at least a subset of the non-volatile resistive switching memory cells utilized to generate the PUF data.

In addition, various embodiments disclose resistive switching device processes utilized to generate high-entropic data sequences that meet or exceed scientific standards for randomness, and are comparable with high-quality cryptographic random number sources. In some embodiments, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. In other embodiments, switching device processes can be selected from resistive switching devices having low cycle count (e.g., less than a dozen program-erase cycles, less than a few hundred program-erase cycles, less than a few thousand program-erase cycles, and so forth), particularly for random number generation (RNG) with good randomness but not requiring highest-quality entropy utilized for cryptography. In general, leveraging physical characteristics of resistive switching devices achieves high non-correlation among devices on a die (intra-die), among dies on a wafer (inter-die) and among wafers in a fabrication facility, minimizing likelihood that a data sequence generated from resistive switching devices on a single die is repeated among dies, devices, wafers, etc.

As utilized herein, non-correlated data produced from physical features of resistive memory, whether PUF data or RNG data, are referred to more generally as identifier data. Some disclosed embodiments propose aggregation of multiple memory cells to define a single bit: also called a differential bit, or the like. Where multiple memory cells leverage physical unclonable features to produce non-correlated data the data can be referred to as a differential identifier bit, or just an identifier bit. Thus, the identifier bit can be a single memory cell producing non-correlated data or multiple memory cells utilized to generate non-correlated data, depending on context.

Program processes to generate data for an identifier bit defined by multiple cells are disclosed herein, and referred to generally as differential program processes. In some embodiments, a differential program process applying a program cycle concurrently to all memory cells defining an identifier bit is provided. In various disclosed aspects of such embodiments, differential programming can include detection of a program event(s) for one (or a group) of the memory cells and disconnection of the multiple cells from supply voltage. Alternative (or additional) aspects include intrinsic suppression of non-programmed memory cells in response to a program event for one (or a group) of the memory cells. These aspects can mitigate or avoid invalid data results for differential programming, as well as reduce power consumption as described in more detail herein (e.g., see FIGS. 3 and 6, infra).

Further embodiments provide a uniform or substantially uniform pitch among memory cells of an array of resistive switching memory cells forming a set of differential identifier bits. The uniform pitch can be provided for a wordline-coupled PUF circuit that connects two (or more) 1T1R ReMEM circuits defining an identifier bit at a pass transistor coupled to a pass wordline (e.g., see FIG. 5, infra). The pass transistor can be positioned among transistors of the 1T1R ReMEM circuits within a diffusion layer of a semiconductor device, in an embodiment. In addition, a memory cell in part or in whole disconnected from the 1T1R ReMEM circuit can be positioned overlying the pass transistor. Moreover, the memory cell can be positioned among memory cells of the 1T1R ReMEM circuits with uniform or substantially uniform pitch there between. This (substantially) uniform pitch can mitigate or avoid variation in electrical characteristics associated with non-uniform memory cell pitch, and simplify and improve a fabrication process associated with forming the array of resistive switching memory cells. Accordingly, the present disclosure provides device and process advantages in resistive memory technology.

Resistive switching memory cells suitable for generating identifier data include two-terminal resistive switching memory cells. Such memory cells can be utilized to generate PUF data and random number generation (RNG) data, Root of trust data, but also one-time programmable (OTP) data and many-time programmable (or re-programmable, overwritable, etc.) (MTP) data. Examples of two-terminal resistive switching memory cells can include: filamentary resistive switching memory (ReMEM), resistive random access memory (RRAM®), phase change memory (PCRAM), conductive-bridging memory (CBRAM®), programmable metallization cell memory (PMC), as well as magnetic memories such as magneto resistive memory (MRAM), spin torque transfer magneto resistive memory (STT-MRAM), vertical transport magneto resistive memory (VMRAM), ferroelectric memory (FeRAM), or other suitable two-terminal charge storage memory(ies). Where suitable to one of ordinary skill in the art, the foregoing memory technologies, similar memory technologies, or suitable subsets thereof are considered within the meaning of two-terminal resistive switching memory for one or more embodiments of the present disclosure.

In one or more additional embodiments, some disclosed sequence generation processes can be rendered permanent through one-time programmable (OTP) processes, allowing a sequence to be reliably re-read over a very large number of read cycles to reliably and accurately reproduce a previously generated data sequence, achieving extremely low bit error rate for data validation applications. In still further embodiments, disclosed processes for generating non-correlated data sequences can involve processes compatible with resistive switching device operation, allowing a set of resistive switching devices to be selected post-fabrication from any suitable subset of resistive switching devices on a chip. Systems and methods are further provided to export control of resistive switching device selection, data sequence process selection and process configuration—associated with physically unclonable data sequence generation disclosed herein—to a user of the chip post-fabrication. Various other embodiments will be readily apparent based on the disclosure herein and the associated drawings.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one of ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (Å), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality(ies) or quantity(ies) that would be suitable to accomplish an explicitly disclosed function(s) or feature(s) of a disclosed element. Accordingly, the subject specification is by no means limited only to specific qualities and quantities disclosed herein, but includes all variations of a specified quality(ies) or quantity(ies) reasonably conveyed to one of ordinary skill in the art by way of the context disclosed herein.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgN_y$, $TiN_y$, $AlN_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein—such as metal-rich nitride or oxide (metal-oxide/nitride with free metal atoms), metal-poor nitride or oxide (metal-oxide/nitride with free oxygen/nitrogen atoms) —as well as other combinations of elements that do not form traditional stoichiometric compounds as understood in the art.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

Overview

FIG. 1 illustrates a block diagram of an example integrated circuit device 100 for an electronic device according to one or more embodiments of the present disclosure. Integrated circuit device 100 includes an array(s) 110 of two-terminal resistive-switching memory cells (though other magnetic switching or charge-trapping two-terminal memory cells can be utilized instead or in addition, as described herein or known in the art). Array(s) 110 of memory can include resistive switching memory cells, and different portions of the resistive switching memory cells can be characterized (and re-characterized, where suitable) for different memory cell functions. Example memory cell functions can include physical identifier functions (e.g., physical unclonable feature (PUF), random number generation (RNG)), one-time programmable (OTP) functions and many-time programmable (MTP) functions (also referred to as rewritable or program/erase functions). Different groups of memory cells of array(s) 110 are provided (or can be characterized) to implement these functions. As described herein, identifier functions can be implemented by way of multiple resistive-switching memory cells collectively defined as an identifier bit (or by single cells defining a bit in some embodiments). Thus, depicted in FIG. 1 are PUF memory bits 112, RNG memory bits 118, OTP memory cells 114 as well as MTP or reversibly programmable memory cells 116. Array(s) 110 of resistive-switching memory cells can be characterized for other types of memory cell functions not specifically depicted in FIG. 1, where suitable. Further, array(s) 110 of resistive-switching memory cells can be characterized for a subset of the illustrated memory cell functions; for instance, PUF bits 112 and MTP bits 116, or PUF bits 112 and OTP bits 114 are suitable examples.

In some disclosed embodiments, one or more of PUF bits 112, OTP bits 114, MTP bits 116 and RNG bits 118 can be allocated to fixed portions—or sub-arrays—of array(s) 110 of resistive-switching memory cells. As an example, PUF bits 112 or RNG bits 118 embodied by differential identifier bit circuits described herein (e.g., see FIGS. 2 and 3, infra) can be positioned within a fixed portion of array(s) 110 that is formed to accommodate intrinsic program suppression of multi-cell differential identifier bit circuits as is described in more detail throughout this specification. In such embodiments, OTP bits 114 and MTP bits 116 can be located within other portions—or sub-arrays—of array(s) 110 that do not accommodate intrinsic program suppression of multi-cell differential identifier bit circuits. However, controller 120 can be configured to utilize a PUF sub-array (e.g., see FIG. 2, infra) for OTP bits 114 and MTP bits 116 in some embodiments, or can utilize a MTP/OTP sub-array for PUF bits 112 or RNG bits 118 without intrinsic program suppression, in at least some embodiments of the present disclosure.

Accordingly, although array(s) 100 of resistive-switching memory cells illustrates designated sections of characterized memory cells, in some embodiments spatial orientation, relative or absolute, is not required by the position of the dotted blocks within array(s) 110 of memory identifying PUF, OTP, MTP, or RNG data. Rather, controller 120 can characterize portions of PUF bits 112 as MTP bits 116, portions of OTP bits 114 as RNG bits or PUF bits 112, and various other combinations. Further, array(s) 110 of resistive-switching memory cells can be uncharacterized (e.g., upon initial fabrication), re-characterized (e.g., in response to re-characterization of cells from RNG to MTP, from MTP to OTP, and so forth), or de-characterized (e.g., removing previous characterizations, where suitable), or the like, as suitable. Accordingly, the characterization of memory cells in array(s) 110 is illustrative only, and array(s) 100 can be wholly uncharacterized, have some of the disclosed characterizations, other characterizations that would be evident to one of skill in the art building upon the context of the present disclosure, and so forth.

In at least one alternative or additional embodiment(s), some memory cells of array(s) 110 of two-terminal resistive-switching memory cells can have a fixed size or number of memory cells located within a group of addresses of array(s) 110 of memory pre-assigned to one operational characteristic (e.g., MTP operation, OTP operation, RNG operation, PUF operation, or the like). Some or all of these pre-assigned memory cells could be re-characterized by controller 120 in some aspects of the disclosure, although some pre-assigned memory cell characterizations can be permanent and not re-characterizable in at least one aspect, and depending on design choice. In such embodiments, a host command received by a controller 120 (e.g., by way of a command/data interface 130; see below) identifying addresses of target memory cells can imply an operation consistent with the pre-assigned operational characteristic associated with those addresses. As an example, a write command targeting memory cell addresses pre-assigned to PUF operational characterization can imply a PUF write command, and so forth. When implementing the write command on memory cells pre-assigned to PUF operation, controller 120 can implement instructions suitable for a PUF write, rather than an MTP write, OTP write, or even a RNG write, as an example. In other embodiments, even where some memory cells of array(s) 110 are pre-assigned a characterization, other memory cells can be un-characterized, and can instead be assigned an operational characterization selected by an end user (or an external host device—not depicted, but see FIG. 12, infra, which could be communicatively coupled to integrated circuit device 100 by way of command/data interface 130 to issue an assignment of operational characterization, or issue a read/write/erase command), where suitable, or can even be dynamically characterized or re-characterized. In various embodiments, trim instructions 122 can store protocols to characterize memory cells according to PUF, RNG, MTP, OTP characterizations, as well as implement memory operations consistent with those characterizations.

Figure 11:
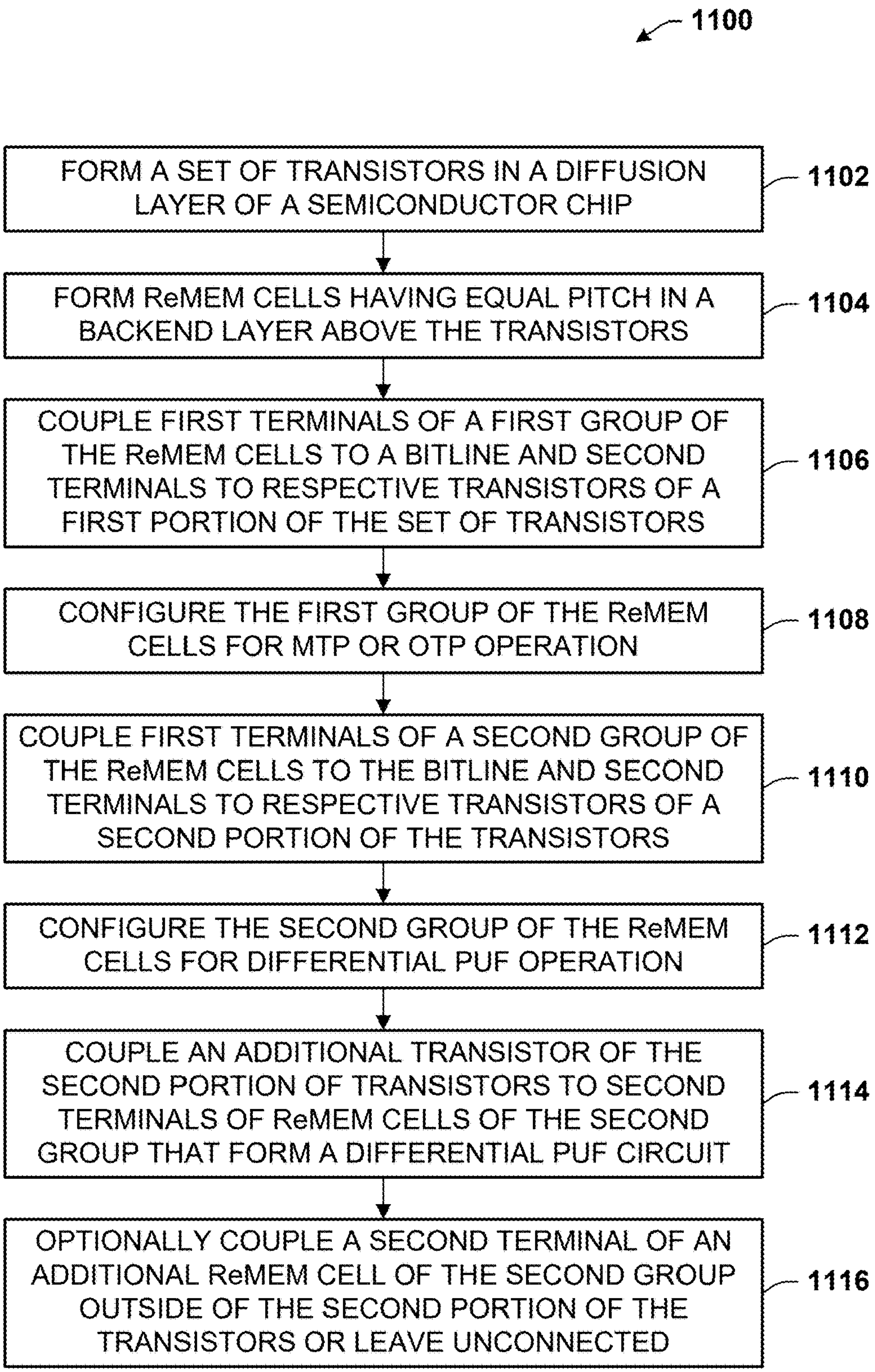
FIG. 11 illustrates a flowchart of an example method for fabricating a PUF circuit and an MTP or OTP circuit utilizing a two-terminal memory array with uniform pitch.

Controller 120 is provided to implement memory operations upon array(s) 110 of resistive-switching memory cells (e.g., see also FIG. 11, infra). Memory operations can include processes such as program (write), read, overwrite, erase, and so forth, operations suitable for operation of MTP bits 116. Memory operations can also include processes for program (write) or reading OTP bits 114. Instructions for implementing memory operations according to the various characterizations can be stored in trim instructions 122.

Also illustrated in integrated circuit device 100 is an input(s) 140 and output(s) 150. In some embodiments, input(s) 140 can include (or provide a pathway for) data to be stored within array(s) 110 of two-terminal resistive-switching memory cells, such as MTP bits 116 or OTP bits 114. Output(s) 150 can output data stored within resistive switching devices of array(s) 110, including PUF bits 112 and RNG bits 118 as well as OTP bits 114 and MTP bits 116. In some embodiments, output(s) 150 can output data that results from computations utilizing data stored in PUF bits 112 (e.g., a cryptographic key validation computation implemented for stored PUF data), or from data stored within MTP bits 116 or OTP bits 114 resulting from other computations, in further embodiments.

A command/data interface 130 is provided to receive memory commands from an external device and respond to those commands. Further, data to be written to array(s) 110 can be received by way of command/data interface 130, and data output from array(s) 110 can be provided over command/data interface 130. In at least some embodiments, controller 120 can dynamically expose selection and (re-) characterization of memory cells of array(s) 110 to an external host device (separate from integrated circuit device 100—not depicted) by way of command/data interface 130. In various example implementations, the external host device can be manufactured separately and communicatively interconnected by one or more network or device interfaces to command/data interface 130 to accomplish this embodiment(s).

In addition to the foregoing, disclosed resistive switching devices have excellent properties for generating PUF data. Such properties include high entropy, which is suitable for generating random or substantially random numbers, low bit error rate (BER), inherent difficulty in reverse engineering or illicit side-channel data access, and fast sensing times. For example, a bit sequence of 128 or 256 PUF bits can be formed from 128 or 256 resistive switching devices or 128/256 differential PUF circuits respectively comprising a group (e.g., a pair, etc.) of multiple such resistive switching devices (see differential PUF circuit 340 of FIG. 3, infra). High randomness in generating PUF bits minimizes non-random patterns between bits of a PUF data sequence, meeting strict randomness standards.

More specifically, bit error rates (BER) s of identifier data generated with disclosed resistive switching devices are extremely low compared to techniques for generating PUF with static random access memory (SRAM). This allows integrated circuit device 100 to generate highly non-correlated identifier bits without special BER-reducing circuitry permanently affixed to memory cells from which identifier data is generated. In at least some embodiments disclosed herein, controller 120 can utilize row and column selection circuitry (including multiplexers; see FIGS. 4 and 12, infra) and processes associated with implementing read, write, erase and other memory operations on resistive switching devices, and extend those circuitry and processes to generating or storing PUF data, RNG data, OTP data, MTP data, and so forth.

In one or more embodiments, controller 120 can be operable to perform memory operations on array(s) 110 of memory. For instance, controller 120 can be operable to perform sensing operations pertaining to generating an identifier data bit from one (or a group of) resistive switching device(s) operably characterized as PUF bits 112 (or RNG bits 118), in an embodiment(s). Examples of non-differential sensing operations pertaining to generating an identifier bit from a single memory cell can include: native current of a never-programmed resistive switching device in the context of PUF data (or leak current of an un-programmed device in the context of RNG data) in response to a sub-program voltage, native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described herein (or as described within U.S. application Ser. No. 17/223,817 incorporated by reference hereinabove). In general, however, these sensing operations can be digitized to generate PUF or RNG data by comparing a measured result of a sensing operation (native current in response to sub-program voltage, detection of program event in response to a program signal, speed or timing of program event, a voltage at which a device becomes programmed, and so forth) to a threshold value(s) stored in trim instructions 122 of controller 120. Generation of PUF data usually involves never-programmed resistive switching memory cells, whereas generation of RNG data can involve never-programmed cells, or un-programmed cells with relatively low program counts (e.g., fewer than 10 program events; fewer than 50 program events; fewer than 100 program events; fewer than 1000 program events; or other suitable value, or any suitable value or range there between), although the subject disclosure is not strictly limited to these definitions.

As further examples, controller 120 can be operable to perform a program operation(s) pertaining to generating an identifier data bit utilizing an identifier memory cell(s) 112, 118 of array(s) 110 of memory. Examples of such program operations include applying a program voltage magnitude to a never-programmed (or un-programmed for RNG data) memory cell and determining whether the cell is programmed or not programmed in response to the applied program voltage magnitude (utilizing a suitable program voltage magnitude threshold or set of thresholds). The identifier data bit can be digitized by assigning a ‘1’ if the cell is programmed, and ‘0’ if not programmed (or vice versa). Further examples include applying a program signal of selected pulse duration to a never-programmed (or un-programmed) memory cell and determining whether the cell is programmed or not programmed after the selected pulse duration (program time threshold(s)). Similar to the previous example, the identifier data bit can be digitized by assigning a '1' if the cell is programmed, and '0' if not programmed (or vice versa). Another example includes applying a sub-program voltage to a never-programmed (or un-programmed) memory cell and determining whether a native (or leak) non-programmed current is above or below a preselected current threshold (native/leak current differentiation). The identifier bit can be digitized by assigning a '1' if native current is above the threshold and assigning a '0' if native current is below the threshold (or vice versa). Other examples or combinations of the foregoing known in the art or reasonably suggested to one of ordinary skill in the art by way of the context provided herein are considered within the scope of the present disclosure.

In still other embodiments, controller 120 can be configured to implement differential operations pertaining to generating an identifier bit from a plurality of resistive switching devices. Generally, differential operations compare response of one or more cells of a plurality of memory cells to a memory operation and digitize an identifier bit associated with the plurality of memory cells based on relative responses of the one or more memory cells. As an example, a differential identifier bit can be defined based on which cell of the plurality of resistive switching devices is programmed in response to a common stimulus. In some disclosed embodiments of the present disclosure, controller 120 can electrically connect second terminals of the plurality of resistive switching devices to suppress inadvertent programming of more than one resistive switching device. The second terminals can be shorted through a pass transistor coupled to a pass wordline, in various aspects (e.g., see FIG. 5, infra). Moreover, a resistive switching memory overlying the pass transistor can be external to (e.g., disconnected from) the differential identifier bit, but nonetheless can facilitate uniform or substantially uniform pitch between resistive switching devices of the plurality of resistive switching devices (e.g., see FIG. 8, infra). The uniform pitch can mitigate or avoid systematic process and electrical variation among resistive switching devices of a differential PUF bit 112, and of resistive switching devices defining MTP bits 116, OTP bits 114, and so forth. Avoiding systematic electrical effects can preserve the stochastic nature of resistive switching memory devices described herein.

More generally, differential operations usable to generate an identifier bit according to aspects of the present disclosure can include: differential program speed of a group of never (or un) programmed memory cells, differential native program voltage of the group of memory cells, differential native (leak) current of the group of memory cells, differential native electrical resistance of the group of memory cells, differential on-state resistance of the group of memory cells, differential erase voltage or current of the group of memory cells, differential delay frequency of the group of memory cells, differential parasitic resistance or capacitance of the group of memory cells, a differential program or erase minimum pulse width or duration of the group of memory cells, or the like, or a suitable combination of the foregoing. For differential operations, using the exemplary case of two cells per identifier bit (though the rule can be extended to three or more cells per identifier bit through proportional logic, optionally for generating multi-bit identifier data with suitable numbers of differential cells), the identifier bit can be digitized by assigning a '0' value to identifier bits in which a first memory cell has higher (or lower) native current/on-state resistance/erase voltage/delay frequency/parasitic resistance or capacitance/program or erase speed, etc., and assigning a '1' to identifier bits in which a second memory cell has the higher (or lower) native current/on-state resistance/erase voltage/delay frequency/parasitic resistance or capacitance/program or erase speed, and so forth. Rules for digitizing identifier bits utilizing differential operations on multiple memory cells can be stored in trim instructions 122, in an embodiment or elsewhere in controller 120 or integrated circuit device 100.

Embodiments of the present disclosure provide improved differential programming of multiple resistive switching memory cells that define an identifier bit. In one aspect of such embodiments, array control circuitry 124 is provided that can include a detection circuit to detect a program event(s) for a first of the multiple resistive switching memory cells (or a first group of such cells). Additionally, array control circuitry 124 can include a termination circuit configured to disconnect the multiple resistive switching memory cells from program voltage in response to detection of the program event(s). This disconnection from program voltage can occur prior to completion of a program cycle associated with the differential programming, as an example (see, for instance, FIG. 4, infra). In at least some embodiments, array control circuitry 124 (or array(s) 110 itself) can provide a common node that can be selectively activated to electrically connect second terminals of the multiple resistive switching memory cells for the differential programming to facilitate intrinsic suppression of an unprogrammed memory cell (or group of such cells) in response to the program event. The intrinsic suppression of un-programmed memory cells can be very rapid (e.g., less than 10 nanoseconds (ns)), greatly mitigating unexpected program events for the differential programming of the identifier bit (e.g., see FIGS. 5 and 6, infra).

In yet other embodiments, controller 120 can be operable to selectively implement one-time programmable operations on selected PUF bits 112 to render permanent a PUF bit sequence generated with a program event at a set of PUF bits 112 (or, e.g., stored at a set of memory cells in response to generation at other memory cells by a non-program event, such as native leak current or the like). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence. This can serve to greatly enhance longevity and accurate read cycle counts of the PUF bit sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier memory cells 112, 118, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a 'l' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bit information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set (optionally stored in trim instructions 122) upon initializing a semiconductor chip.

Figure 2:
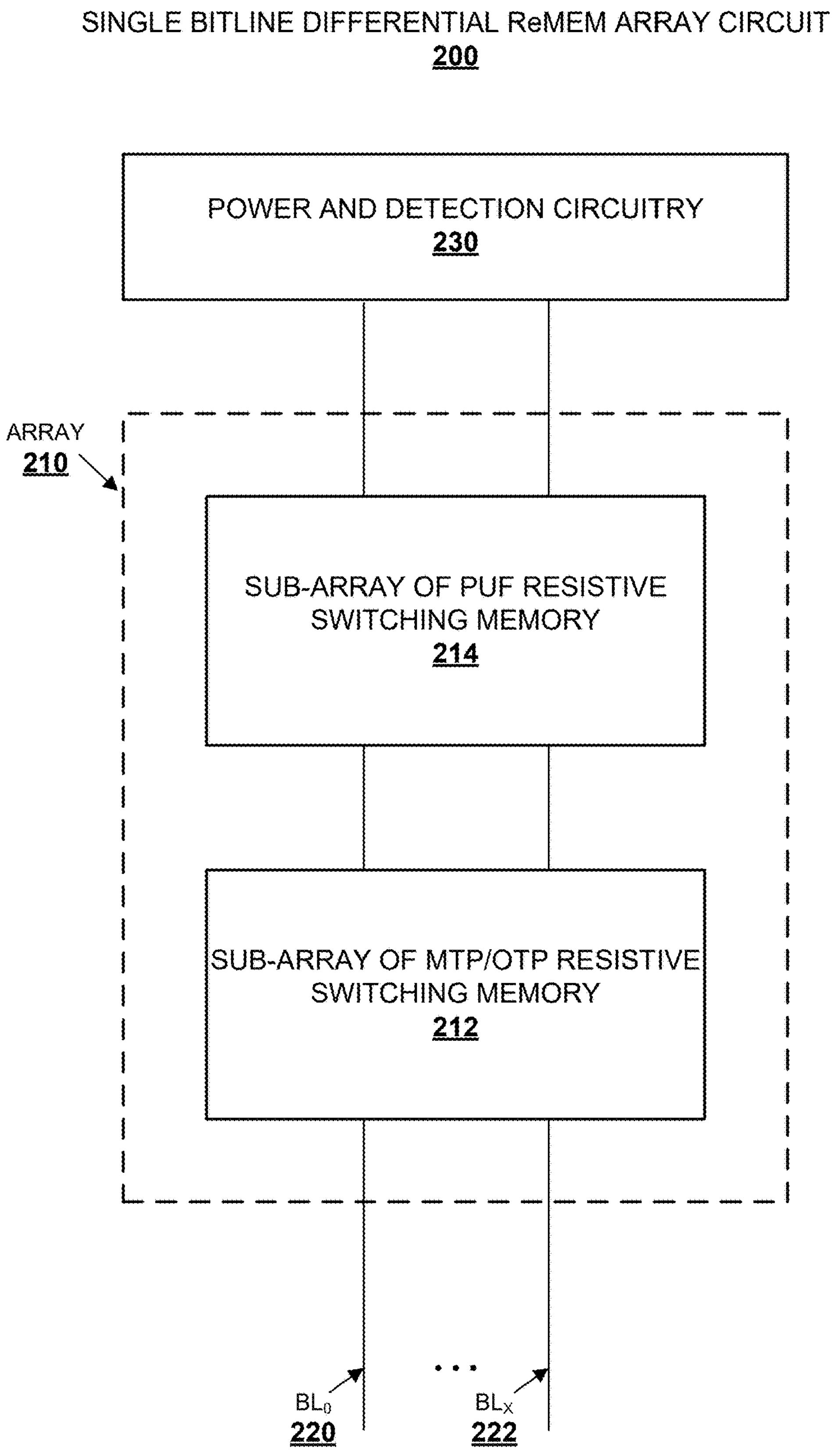
FIG. 2 illustrates an example block diagram of a ReMEM array having a PUF sub-array and a MTP or OTP sub-array connected to a common bitline, in further embodiments.

FIG. 2 illustrates a block diagram of an example differential resistive memory (ReMEM) array circuit 200 in further embodiments of the present disclosure. ReMEM array circuit 200 includes an array 210 of resistive switching memory coupled to power and detection circuitry 230 by a plurality of bitlines, including $\text{bitline}_0$ 220 through $\text{bitline}_2$ 222 (referred to hereinafter collectively as bitlines 220-222), where x is any suitable integer greater than zero. Array 210 can be substantially the same as array(s) 110 of memory of FIG. 1, supra, in one or more embodiments. In other embodiments, array 210 can be a portion of array(s) 110—including PUF bits 112 and MTP bits 116—or can include some of the characteristics described above with respect to array(s) 110 of memory in an embodiment(s), can have different characteristics than described above in other embodiments, and so forth.

As shown, array 210 can include a sub-array of PUF resistive switching memory 214 and a sub-array of MTP or OTP resistive switching memory 212. Moreover, sub-array of PUF resistive switching memory 214 and sub-array of MTP/OTP resistive switching memory 212 can each be connected to a common bitline, including one or more of bitlines 220-222 (or all of bitlines 220-222). Power and detection circuitry 230 can provide electrical power: including voltage and current to circuits of sub-array of PUF resistive switching memory 214 and to circuits of sub-array of MTP/OTP resistive switching memory 212 on one or more of bitlines 220-222. Additionally, voltage or current on bitlines 220-222 can be monitored by power and detection circuitry 230 to detect a resistance change in a circuit of sub-array of PUF resistive switching memory 214 or a circuit of sub-array of MTP/OTP resistive switching memory 212.

Figure 3:
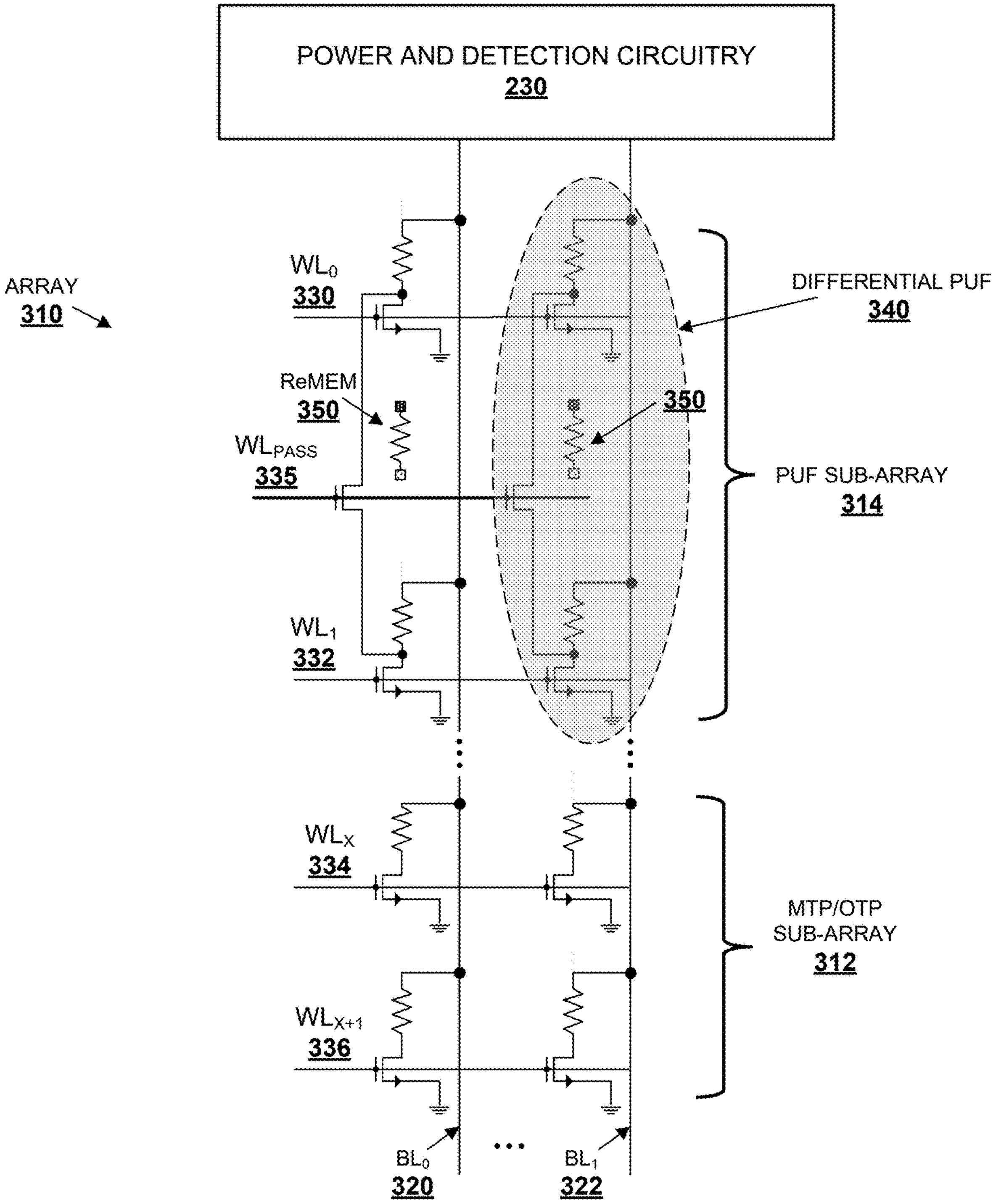
FIG. 3 depicts a schematic diagram of an example differential PUF array and a MTP array on a common bitline with consistent pitch, in additional embodiments.

Referring now to FIG. 3, there is disclosed a differential ReMEM array circuit 300 according to various embodiments of the present disclosure. Differential ReMEM array circuit 300 includes an array 310 defining multiple sub-arrays. A PUF sub-array 314 includes differential identifier circuits comprising multiple resistive memory cells. A differential PUF circuit 340 is shown, though PUF sub-array 314 can include differential RNG circuits as well. Generally, a differential PUF circuit 340 will comprise resistive memory cells having never been programmed or programmed less than a threshold number of times (e.g., 1, 2, 5, etc.), whereas a differential RNG sub-array will comprise resistive memory cells having been programmed more than the threshold number of times, and optionally less than a second threshold number of times (e.g., 50, 100, 1000, etc.). Differential PUF circuit 340 can also comprise resistive memory cells storing PUF data—generated by a differential PUF write process, and likewise differential RNG circuits can comprise resistive memory cells storing RNG data—generated by a differential RNG write process.

PUF sub-array 314 includes a set of bitlines, including $BL_0$ 320 and $BL_1$ 322 (referred to collectively as bitlines 320-322), and a set of wordlines including $WL_0$ 330 and $WL_1$ 332. A pass wordline 335 is also shown. Wordlines $WL_0$ 330 and $WL_1$ 332 will be referred to hereinafter collectively as wordlines 330-332, whereas pass wordline 335 will be referred to separately. In addition, array 310 includes a MTP/OTP sub-array 312. This sub-array of array 310 also includes bitlines 320-322 and a different set of wordlines: including wordline $WL_X$ 334 and $\text{wordline}_{X+1}$ 336, referred to collectively as wordlines 334-336. Note that MTP/OTP sub-array 312 is depicted without a pass wordline 335; although in at least some embodiments a pass wordline can be provided between wordlines 334-336 (e.g., see FIG. 9, infra).

Figure 5:
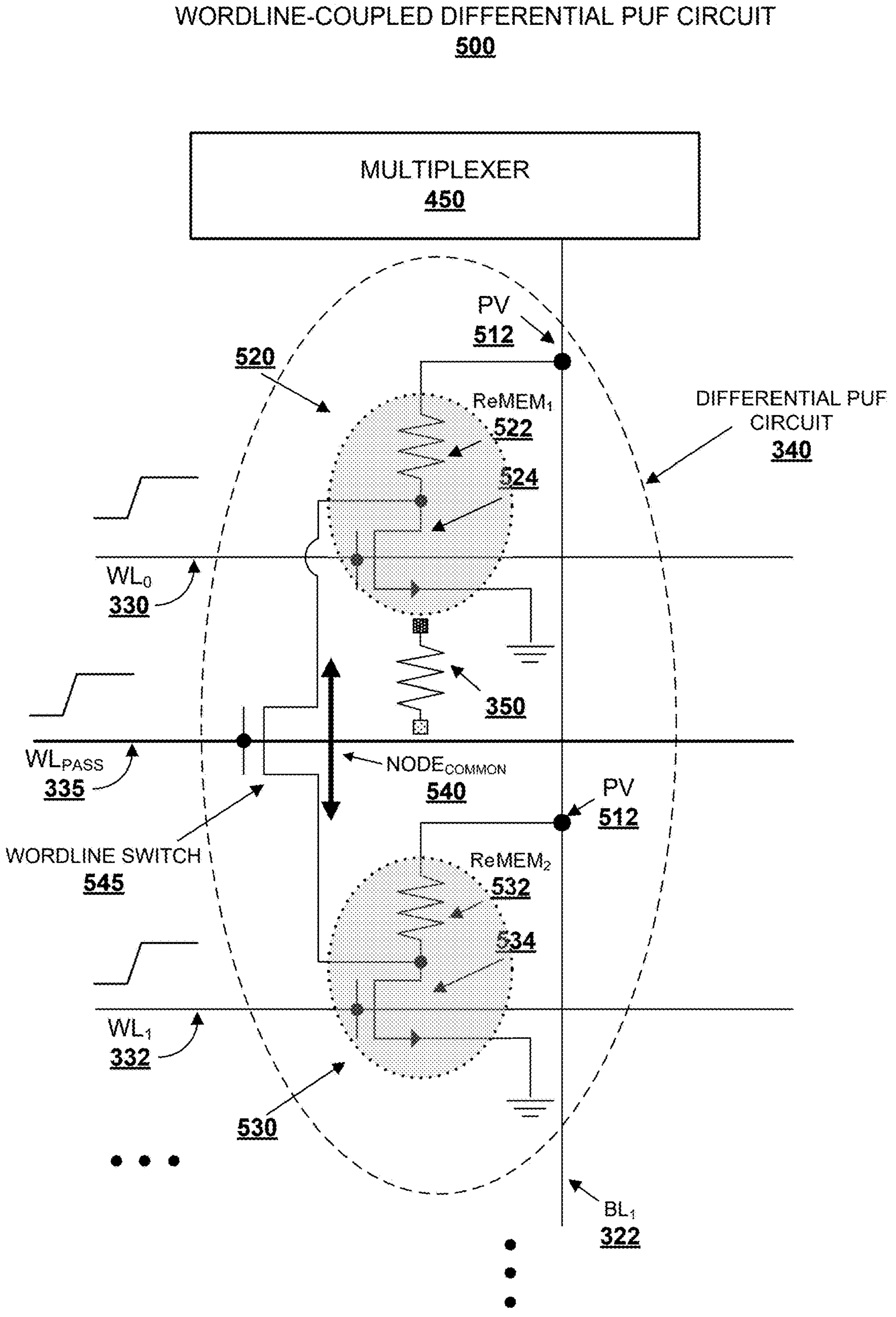
FIG. 5 depicts a schematic diagram of an example differential PUF circuit with uniform inter-ReMEM pitch in one or more embodiments.

Differential PUF circuit 340 can include a first one-transistor, one-resistor (1T1R) memory circuit and a second 1T1R memory circuit, as is described in more detail at FIG. 5, infra. Further, a pass transistor having a gate node coupled to pass wordline 335 can be activated to electrically connect second terminals of resistive memory cells of the 1T1R memory circuits, and can be deactivated to electrically disconnect or isolate the second terminals of the resistive memory cells of the 1T1R memory circuits from each other. A transistor of a first 1T1R memory circuit has a gate node coupled to $WL_0$ 330 to connect or disconnect the resistive memory cell of the first 1T1R memory circuit to ground (or a low/opposite polarity voltage, as suitable). Similarly, a transistor of the second 1T1R memory circuit has a gate node coupled to $WL_1$ 332 to connect or disconnect the resistive memory cell of the second 1T1R memory circuit to ground (or low/opposite polarity voltage).

Of note, differential PUF circuits 340 (and differential RNG circuits) are coupled to a single bitline of bitlines 320-322. For example, differential PUF circuit 340 highlighted by the dashed oval in FIG. 3 is coupled to $BL_1$ 322 but is not coupled to $BL_0$ 320. Accordingly, differential memory operations applied to differential PUF circuit 340 are implemented through bitline $BL_1$ 322 (and wordlines 330-332) and are independent of bitline $BL_0$ 320. Thus, a PUF write operation, PUF read operation, and program detection functions are implemented through power and detection circuitry 230 on $BL_1$ 322 utilizing wordlines 330-332 (and optionally pass wordline 335).

Within the area of differential PUF circuit 340 highlighted by the dashed oval is an additional ReMEM cell 350. ReMEM cell 350 can be formed to secure a uniform or substantially uniform pitch between resistive switching memory cells of differential PUF circuit 340. This (substantially) uniform pitch can mitigate or avoid systemic variation in electrical characteristics among resistive switching devices of PUF sub-array 314. In further embodiments, ReMEM cell 350 can secure uniform or substantially uniform pitch among resistive switching memory cells of differential PUF circuit 340, and between resistive switching devices of PUF sub-array 314 and resistive switching devices of MTP/OTP sub-array 312. Accordingly, the same or similar process can be utilized in fabricating resistive switching devices of MTP/OTP sub-array 312 and resistive switching devices of PUF sub-array 314, minimizing process costs in fabricating the resistive switching devices of array 310. Moreover, electrical characteristics of resistive switching devices in MTP/OTP sub-array 312 can be systematically similar to those in PUF sub-array 314. In addition to avoiding expense in processing costs, maintaining uniform switching device pitch can avoid non-stochastic variation in electrical characteristics that undermine the non-correlation of data optimal for generating identifier data.

Figure 7:
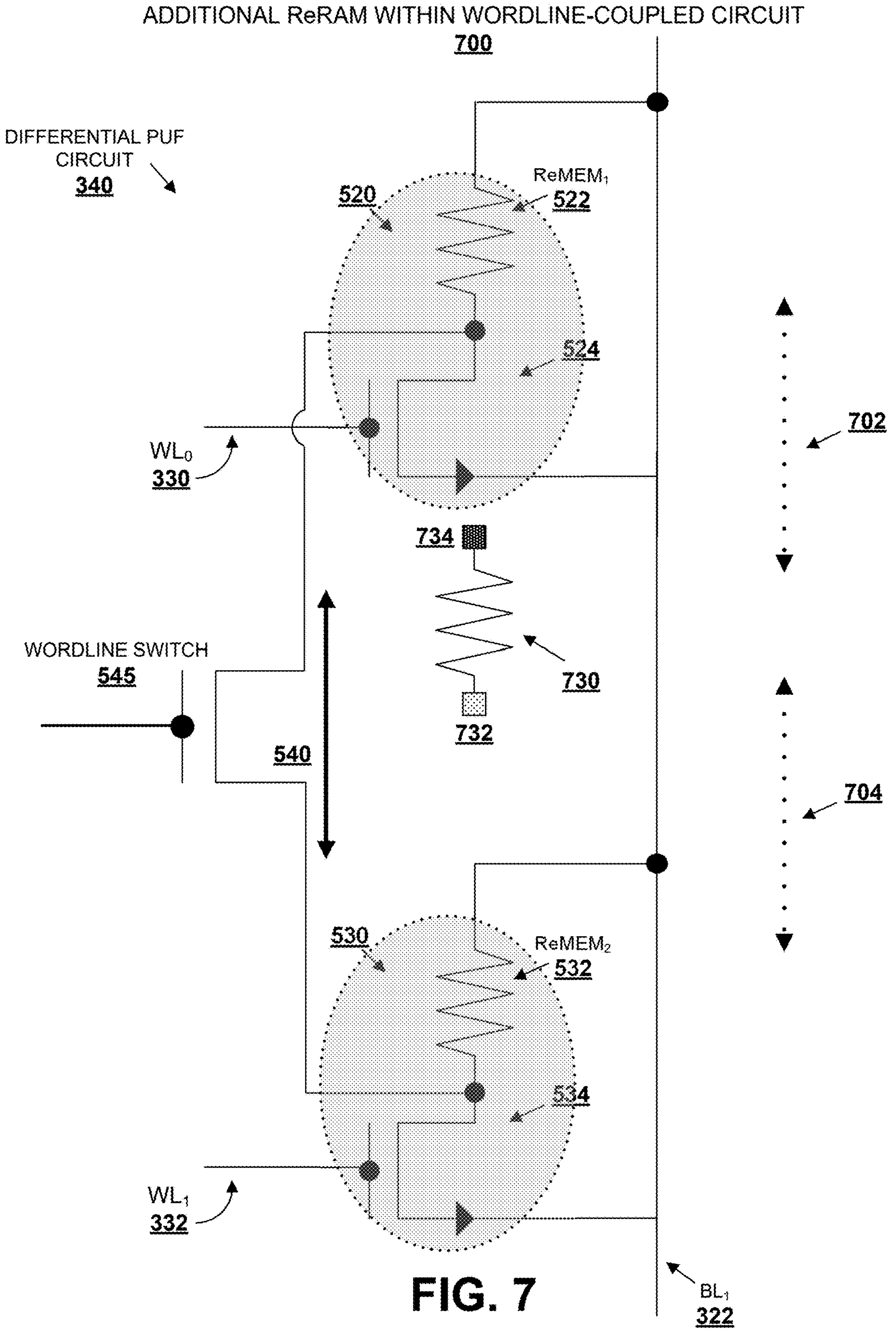
Figure 8:
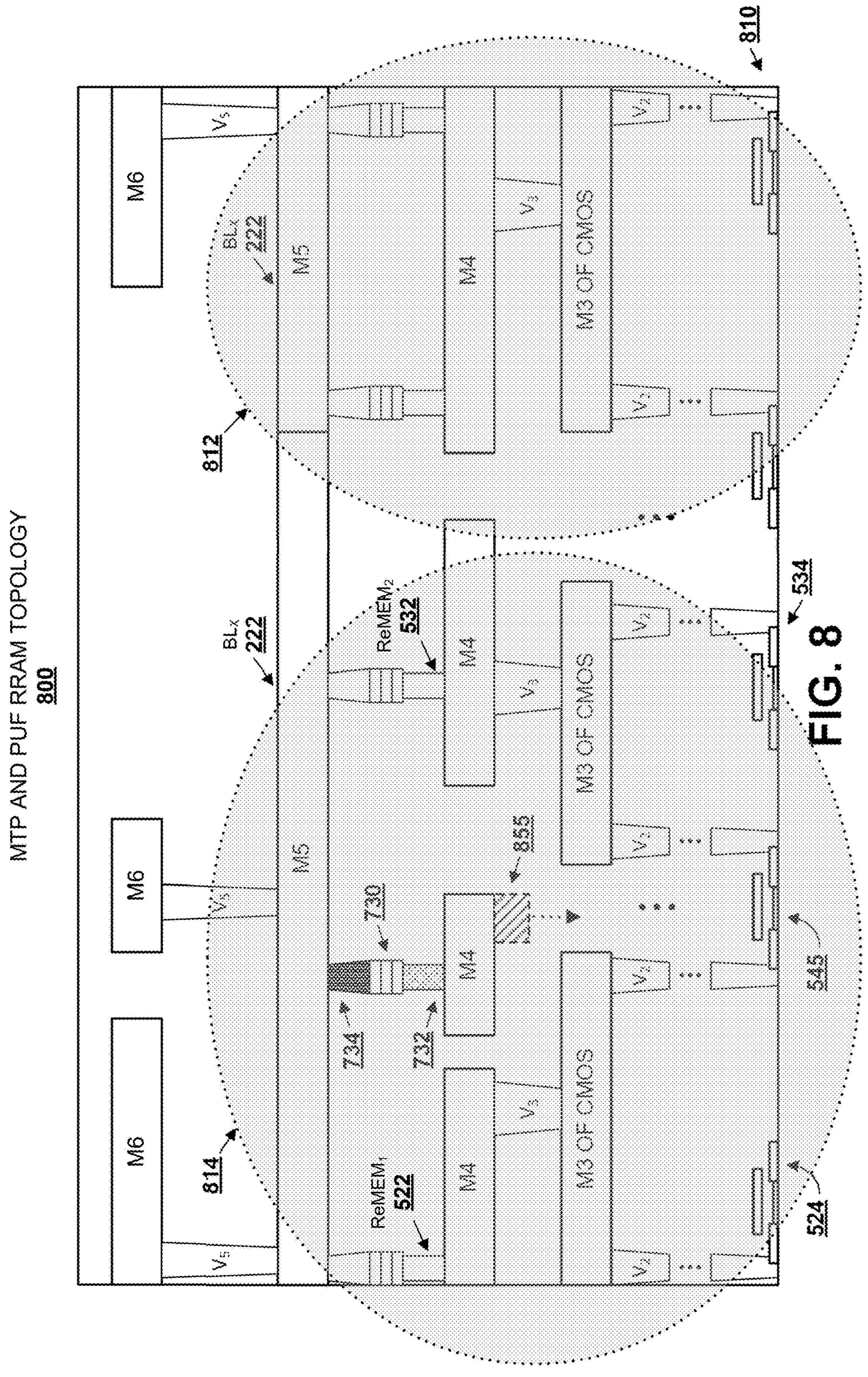
FIG. 8 depicts a topological diagram showing a PUF circuit, an MTP or OTP circuit and an adjacent ReMEM cell on a common bitline, in an embodiment.

In addition to the foregoing, ReMEM cell 350 is at least in part disconnected from differential PUF circuit 340 (see FIGS. 7 and 8, infra). Moreover, ReMEM cell 350 does not participate in generating or storing a PUF bit as part of differential PUF circuit 340. In some embodiments, ReMEM cell 350 can be connected to a circuit external to PUF sub-array 314. As one example, ReMEM cell 350 can be connected to a transistor external to (e.g., at a periphery of) a portion of a diffusion layer in which transistors of differential PUF circuit 340 are formed (see also, e.g., FIG. 8, infra). In such an embodiment(s), ReMEM cell 350 can form a memory circuit located (at least in part) external to differential PUF circuit 340. This promotes improved resistive switching device density for a given resistive switching device process, in addition to mitigating systematic electrical perturbation. In at least one alternative embodiment, ReMEM cell 350 (or a subset of ReMEM cells 350 of PUF sub-array 314) is in part or in whole disconnected from circuitry of an integrated circuit device, and still achieves uniform switching device pitch and mitigates systematic electrical perturbation, but at lower memory density.

Figure 4:
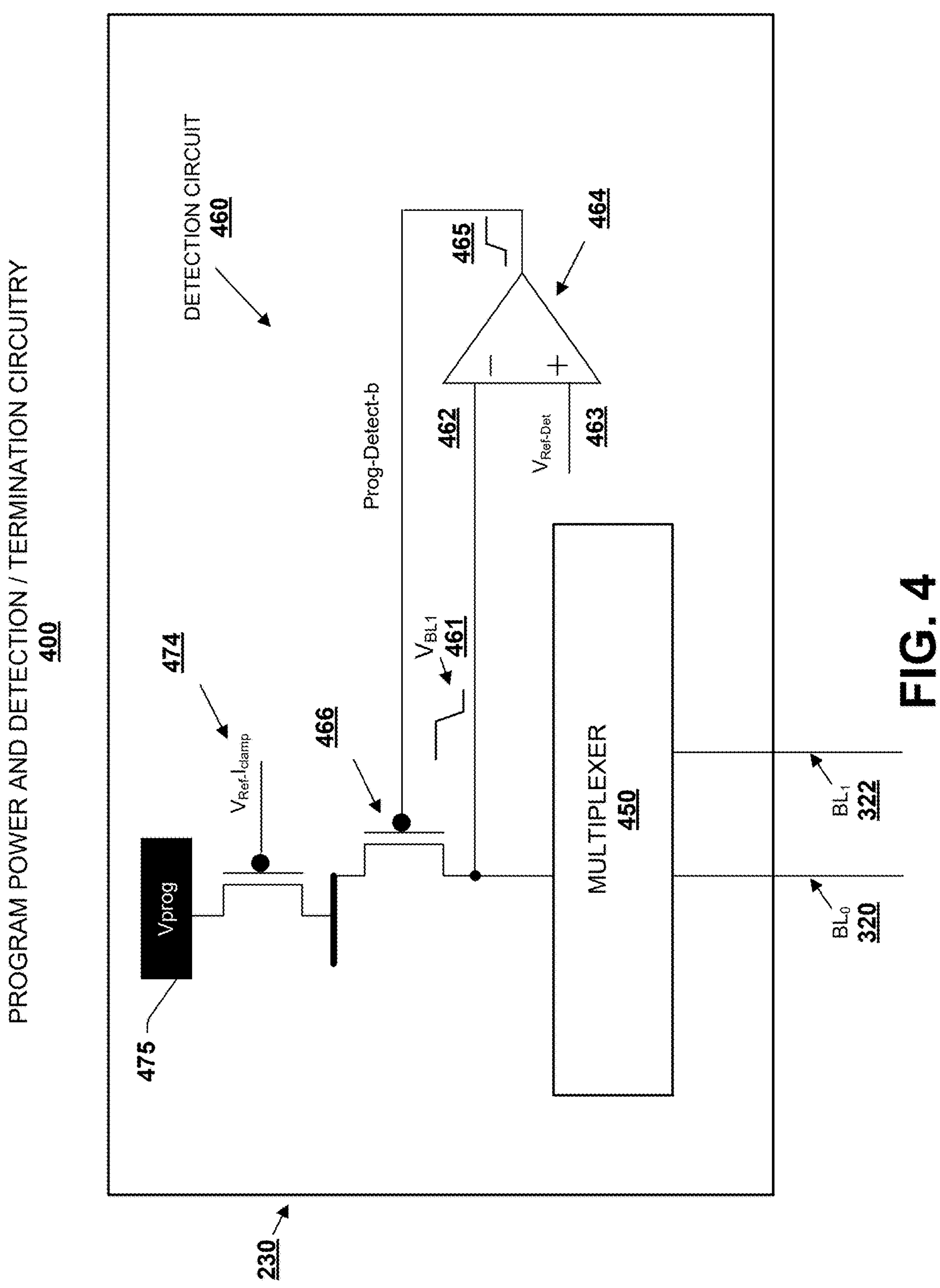
FIG. 4 illustrates an example power and detection circuit for a differential PUF program circuit according to still further embodiments of the present disclosure.

FIG. 4 illustrates a block diagram of an example program power and detection/termination circuitry 400 according to one or more embodiments of the present disclosure. Circuitry 400 includes power and detection circuitry 230 coupled to bitlines 320-322 of array 310. A multiplexer 450 can be connected to bitlines 320-322 and configured to selectively connect or disconnect any subset of bitlines 320-322 (including no bitlines and all bitlines) to a power source 475. Interconnection of multiplexer 450 with power source 475 can be through a voltage reference and current clamping transistor 474, in some embodiments. Further, interconnection of multiplexer 450 with power source 475 can also be through a shut-off transistor 466 of a detection circuit 460, in further embodiments.

As described in more detail throughout this specification, power and detection circuitry 230 can sense one (or more) of bitlines 320-322 in response to a program signal applied to that bitline(s) (e.g., see program voltage 512 of FIG. 5, infra). In the following example, a program signal applied to $\text{bitline}_1$ 322 is used as an example. In response to the program signal applied to such bitline, a resistive switching device of a differential PUF circuit 340 coupled to $\text{bitline}_1$ 322 can transition to a low resistance state. This forms a low resistance path to ground on $\text{bitline}_1$ 322, which in turn pulls a voltage on $\text{bitline}_1$ 322 to a lower voltage. This lower voltage 461, transferred from bitline 322 by way of multiplexer 450, is received by detection circuit 230 and provided to an inverting (−) input 462 of a voltage comparator 464. As shown, the voltage comparator receives a reference voltage at a non-inverting (+) input 463. The reference voltage can be selected to be less than the program voltage applied to $\text{bitline}_1$ 322 for a differential PUF bit, and larger than the lower voltage 461 resulting from programming of the memory cell of differential PUF circuit 340. Accordingly, in response to the bitline voltage dropping to lower voltage 461, the voltage comparator changes its output signal from a low voltage to a high program detect signal 465. High program detect signal 465 deactivates a pmos transistor operating as shut-off transistor 466. This electrically isolates power supply 475 from multiplexer 450 and $\text{bitline}_1$ 322, and when accomplished prior to a duration of a program cycle for differential PUF circuit 340, can reduce overall power consumption associated with the program cycle. In various embodiments, the voltage comparator can be deactivated (e.g., unpowered) to reset low program detect signal 465 and activate the pmos transistor of shut-off transistor 466, allowing multiplexer 450 to again connect one or more bitlines 320-322 to voltage reference and current clamping transistor 474 and voltage supply 475.

FIG. 5 depicts a wordline-coupled differential PUF circuit 500 suitable for a PUF write operation of differential PUF circuit 340 according to additional embodiments of the present disclosure. To implement the PUF write operation for differential PUF circuit 340, a program voltage (e.g., provided by program supply 475 of FIG. 4, supra) is supplied to multiplexer 450 and connected to $BL_1$ 322. This results in program voltage 512 applied at a first terminal of a resistive $\text{memory}_1$ 522 of first 1T1R memory circuit 520 coupled to $BL_1$ 322, and program voltage 512 applied at a first terminal of a second resistive $\text{memory}_2$ 532 of second 1T1R memory circuit 530 also coupled to $BL_1$ 322.

In addition, pass wordline 335 is activated with a high voltage, as shown by the signal diagram going from low to high on pass wordline 335. The high signal on pass wordline 335 activates wordline switch 545 (a pass transistor) by way of a gate node coupled to pass wordline 335. As a result, a channel node of wordline switch 545 becomes electrically conductive and forms a common node 540 between second terminals of resistive $\text{memory}_1$ 522 and resistive $\text{memory}_2$ 532, as shown in wordline-coupled differential PUF circuit 500. Further, wordlines 330-332 become activated (e.g., concurrently) as shown by respective signal diagrams going from low signal to high signal at wordlines 330-332. This activates transistor 524 of 1T1R memory circuit 520 and activates transistor 534 of 1T1R memory circuit 530, coupling the second terminals of resistive $\text{memory}_1$ 522 and of resistive $\text{memory}_2$ 532 to ground (or to a low voltage, or opposite polarity voltage from program voltage 512, as suitable for a program operation of the resistive memory cell technology employed for differential PUF circuit 340). Accordingly, the program voltage 512 is applied as a potential difference across resistive $\text{memory}_1$ 522 and resistive $\text{memory}_2$ 532.

FIG. 5 illustrates a common source arrangement for 1T1R memory circuit 520 (and for 1T1R memory circuit 530), in which the $\text{ReMEM}_1$ 522 is coupled to $BL_1$ 322 and $\text{ReMEM}_2$ 532 is also coupled to $BL_1$ 322. However, the subject disclosure is not limited to this arrangement. For instance, alternative embodiments support a source-follower configuration in addition or instead. In this source-follower configuration the transistors are swapped in electrical series with the ReMEM cells. Thus, transistor 524 is coupled at a first channel node (source or drain) to $BL_1$ 322 and coupled at a second channel node (drain/source) to a first terminal of $\text{ReMEM}_1$ 522, whose second terminal is coupled to ground. Likewise, for $\text{ReMEM}_2$ 532 the source-follower configuration has transistor 534 coupled to $BL_1$ 322 and to a first terminal of $ReMEM_2$ 532, whose second terminal is coupled to ground.

In response to the program voltage 512 across resistive $memory_1$ 522 and resistive $memory_2$ 532, either memory cell can become programmed to a low resistance state. As an example, take the case where resistive $memory_1$ 522 becomes programmed to the low resistance state. Previously when unprogrammed and in a high resistance state, the electrical resistance from program voltage 512 (incorporating line resistance on $BL_1$ 322), the high electrical resistance of unprogrammed resistive $memory_1$ 522 and low electrical resistance of activated transistor 524 is dominated by the high electrical resistance of unprogrammed resistive $memory_1$ 522. This results in almost all voltage across 1T1R memory circuit 520 being dropped across the dominant resistance of resistive $memory_1$ 522, such that approximately program voltage 512 (e.g., about 3 volts) appears at the first terminal of resistive $memory_1$ 522 and approximately zero volts appears at the second terminal of resistive $memory_1$ 522. When resistive $memory_1$ 522 becomes programmed to a low resistance state, the line resistance on $BL_1$ 322 and low electrical resistance of activated transistor 524 become relevant, causing the voltage provided by $BL_1$ 322 to be divided in proportion to the relative electrical resistances at the first terminal of resistive $memory_1$ 522 and at the second terminal of resistive $memory_1$ 522. This effectively pulls the voltage at the second terminal of resistive $memory_1$ 522 up from about zero to a moderate voltage, such as within a range from about 0.3 volts to about 1.5 volts, or any value or range there between (e.g., 0.4 volts, 0.5 volts, 0.6, volts . . . 1.3 volts, 1.4 volts; or 0.3 volts to 1.2 volts; 0.4 volts to 1 volt; 0.5 volts to 0.9 volts, and so on). For the purposes of this example, the voltage of the second terminal of resistive $memory_1$ 522 is pulled up to about 1 volt.

Because common node 540 electrically couples second terminals of resistive $memory_1$ 522 and resistive $memory_2$ 532, the pullup voltage at the second terminal of resistive $memory_1$ 522 (e.g., 0.3 volts to 1.5 volts; or approximately 1 volt for purposes of this illustrative example) will also be applied at the second terminal of resistive $memory_2$ 532. This reduces the voltage dropped across resistive $memory_2$ 532 to $=V_{PROGRAM}-V_{PULLUP}$, or descriptively: program voltage 512—the pullup voltage. In various disclosed embodiments, program voltage 512, the pullup voltage or both can be selected to result in program voltage 512—the pullup voltage=a sub-program voltage, insufficient to cause resistive $memory_2$ 532 to become programmed to a low resistance state. As a result, in response to resistive $memory_1$ 522 becoming programmed to the low resistance state, resistive $memory_2$ 532 is suppressed from becoming programmed to the low resistance state. For differential programming this is quite beneficial as it avoids a potential digital error condition where both cells become programmed, e.g., when trim instructions 122 of controller 120 define only two valid states for a differential PUF circuit 340. Due to the nature of common node 540, the reverse is also true. In response to resistive $memory_2$ 532 becoming programmed to the low resistance state, resistive $memory_1$ is also suppressed from becoming programmed to the low resistance state. Moreover, this intrinsic suppression can happen very rapidly: less than 10 nanoseconds (ns), less than 8 ns, less than 5 ns, less than 3 ns, etc., depending on resistance of wordline switch 545, which also can be selected to achieve a desired intrinsic suppression time (e.g., of less than 10 ns).

As shown by FIG. 5, an additional ReMEM cell 350 is situated between resistive $memory_1$ 522 of 1T1R memory circuit 520 and resistive $memory_2$ 532 of 1T1R memory circuit 530. Additional ReMEM cell 350 is not fully coupled to differential PUF circuit 340. In some embodiments, additional ReMEM cell 350 can be partially coupled to differential PUF circuit 340, such as having one terminal connected to $BL_1$ 322 and having a second terminal decoupled from differential PUF circuit 340, or vice versa, or some other arrangement. In other embodiments, additional ReMEM cell 350 can be entirely decoupled from differential PUF circuit 340. In various alternative embodiments, however, additional ReMEM cell 350 can have the same or approximately the same spacing between resistive $memory_2$ 532 and between resistive $memory_1$ 522. Moreover, the spacing between additional ReMEM cell 350 and resistive $memory_1$ 322 or resistive $memory_2$ 332 can be equal to or approximately equal to a spacing between ReMEM cells of MTP/OTP sub-array 312 shown in FIG. 3 (see FIG. 8, infra).

Figure 6:
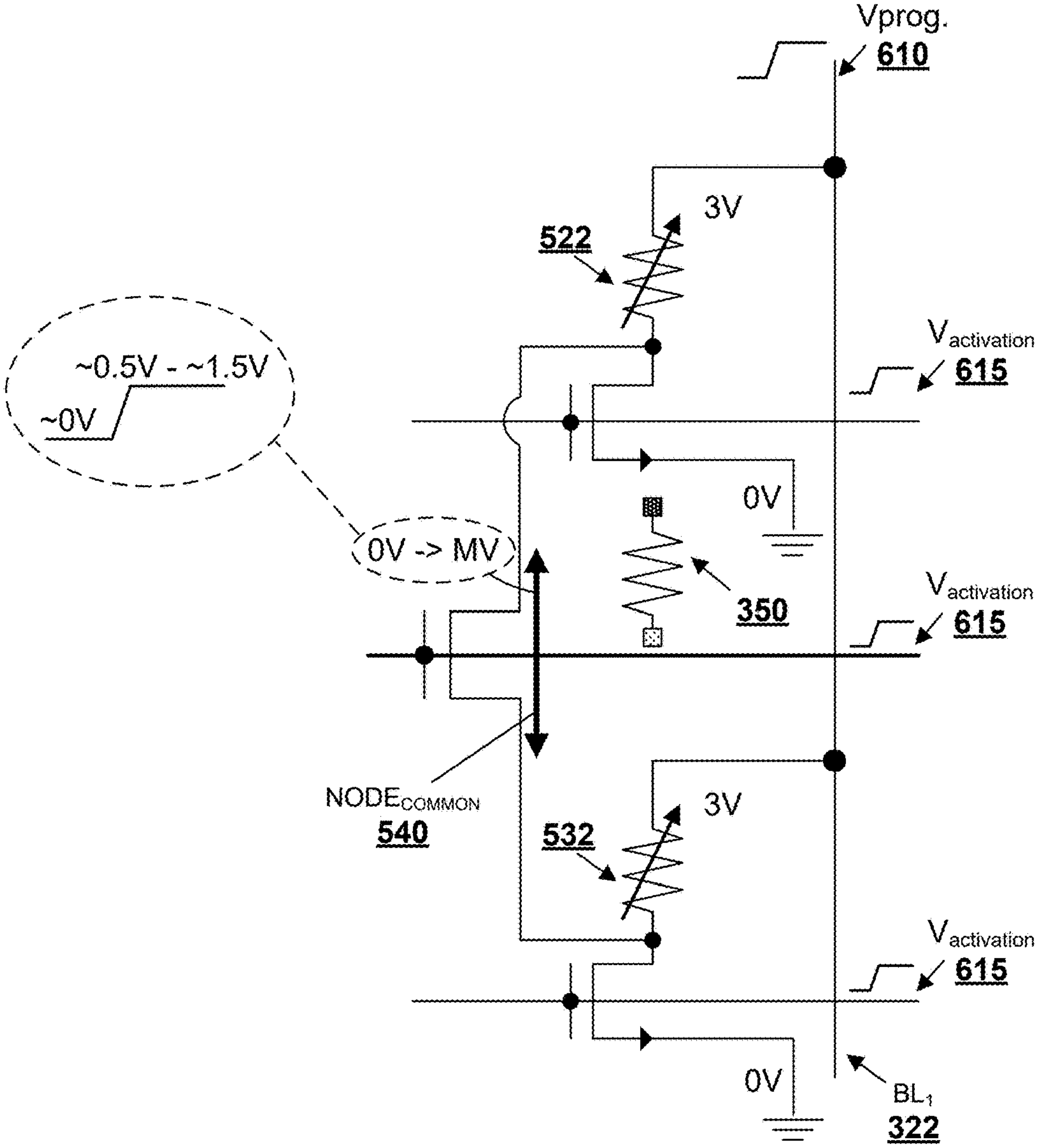
FIG. 6 illustrates a schematic diagram of the example differential PUF circuit for a wordline-coupled differential PUF program operation, in disclosed aspects.

FIG. 6 illustrates an example schematic diagram for a differential PUF program event 600 according to further embodiments. PUF program event 600 shows program voltage 610 applied to $BL_1$ 322 and activation voltages 615 applied to wordlines 330-332 and to pass wordline 335. This results in activation of wordline switch 545 to couple common node 540 to respective second terminals of resistive $memory_1$ 522 and resistive $memory_2$ 532, and to couple those second terminals and common node 540 to ground through transistors 524 and 534. Accordingly, the program voltage (e.g., ~3V) appears at first terminals of resistive $memory_1$ 522 and resistive $memory_2$ 532 and (approximately) zero volts across channel regions of transistors 524 and 534, as shown.

In response to one of: resistive $memory_1$ 522 and resistive $memory_2$ 532 programming to a low resistance state, common node 540 rapidly rises from about 0 volts to a moderate voltage. In various embodiments, depending on relative resistance of the resistive memory cell in the program state, resistance of transistor 524 or 534 in the activated state and resistance on $bitline_1$ 322, this moderate voltage can be between about 0.3 volts and about 1.5 volts, or any suitable value or range there between (e.g., depicted as about ~0.5 v to ~1.5 v in FIG. 6, but not limited to this range). The increase of common node 540 to the moderate voltage intrinsically reduces the voltage dropped across the unprogrammed memory cell to 3V—moderate voltage, which is selected to be less than a program voltage associated with causing the unprogrammed memory cell to transition to the low resistance state. Accordingly, response to a first of: resistive $memory_1$ 522 and resistive $memory_2$ 532 becoming programmed, a second of: resistive $memory_1$ 522 and resistive $memory_2$ 522 is suppressed from becoming programmed.

FIG. 7 depicts a close-up view 700 of an additional ReMEM cell 730 among resistive memory cells of a wordline-coupled differential PUF circuit 340 according to further embodiments of the present disclosure. For instance, additional ReMEM cell 730 can be positioned between resistive $memory_1$ 522 of 1T1R memory circuit 520 and resistive $memory_2$ 532 of 1T1R memory circuit 530, as described herein. As shown, additional ReMEM cell 730 can have a first spacing 702 between additional ReMEM cell 730 and resistive $memory_1$ 522 within an array of resistive memory (e.g., array(s) 110 of two-terminal resistive-switching memory cells). Likewise, additional ReMEM cell 730 can have a second spacing 704 between additional ReMEM cell 730 and resistive memory$_2$ 532 within the array of resistive memory. First spacing 702 and second spacing 704 can be the same or approximately the same, in some aspects of the disclosed embodiments.

In addition to the foregoing, additional ReMEM cell 730 includes a first terminal 732 and a second terminal 734. One, but not both, of first terminal 732 and second terminal 734 can be coupled to an element of differential PUF circuit 340. In an embodiment, first terminal 732 or second terminal 734 can be coupled to either: $BL_1$ 322, or $WL_1$ 332 or $WL_0$ 330, or common node 540 as examples. In further aspects of such embodiments, a second terminal of additional ReMEM cell 730 can be coupled to a conductive path (e.g., comprising one or more metal layers, metal vias, metal interconnects, or the like) leading to a CMOS device within a diffusion layer at a periphery of transistor 524 and transistor 534. In at least one disclosed aspect, one or both of first terminal 732 and second terminal 734 can be uncoupled, rendering additional ReMEM cell 730 unfunctional.

FIG. 8 illustrates an example semiconductor topology 800 showing resistive switching memory cells among back-end-of-line layers of an integrated circuit device. Semiconductor topology 800 depicts an MTP segment 812 in which ReMEM devices are configured for many-time programmable operation. Adjacent to MTP segment 812 within semiconductor topology 800 is a PUF segment 814 in which ReMEM devices are configured for generating physical unclonable function data.

Distance between ReMEM devices (also referred to as pitch) in MTP segment 812 can have a first dimension, and distance between ReMEM devices in PUF segment 814 can have a second dimension. In various embodiments, the first dimension can be the same or approximately the same as the second dimension. Uniform pitch can improve uniformity in fabrication process(es) utilized for fabricating an array of ReMEM devices, reducing cost of fabrication. Additionally, the uniform pitch can minimize systematic electrical characteristics among the ReMEM devices. Note that minimizing systematic electrical variation by maintaining (approximately) uniform pitch between ReMEM devices does not undermine stochastic variation within individual ReMEM devices utilized for generating PUF data as described herein. Rather, since systemic variation often undermines non-correlation of switching characteristics, minimization of systematic electrical variation can instead enhance effectiveness of the stochastic variation utilized to generate PUF data.

Semiconductor topology 800 can comprise a diffusion layer 810 having diffusion layer devices formed therein. Examples of diffusion layer devices can include transistors, a power source(s), a ground, capacitors, inductors, logic circuits, field programmable gate arrays, or the like, logical combinations of the foregoing, and so forth. Vertical interconnects: $V_2$ provide electrical contact between diffusion layer 810 and devices thereon to conductive layers (e.g., CMOS conductive material) overlying diffusion layer 810. It should be appreciated that $V_2$ vertical interconnects can include multiple layers of vertical conductive material between diffusion layer 810 and the lowest conductive layer shown indicated as M3 of CMOS (e.g., a first vertical interconnect $V_0$ between diffusion layer 810 and a M1 of CMOS—not shown—a second vertical interconnect $V_1$ between M1 and a M2 of CMOS—not shown, and then a third vertical interconnect $V_2$ between M2 and M3, as shown, or other suitable arrangement known in the art or reasonably conveyed to one of ordinary skill in the art by way of the context provided herein).

As shown in FIG. 8, a set of ReMEM devices are provided between M4 and M5 conductive layers. PUF segment 814 illustrates an example topological arrangement for differential PUF circuit 340, in an embodiment, and MTP segment 812 can provide an example topological arrangement for 1T1R circuits of MTP/OTP sub-array 312. For instance, a $ReMEM_1$ cell 522 can be connected at a second terminal to a source or node terminal of transistor 524 (through M4 layer, $V_3$ interconnect, M3 layer, $V_2$ interconnect, and so on), and at a first terminal to a bitline 322 embodied by a segment of M5 layer overlying $ReMEM_1$ cell 522. Meanwhile, a $ReMEM_2$ cell 532 is connected at a second terminal to a source or drain node of transistor 534 and connected at a first terminal to M5 layer overlying $ReMEM_2$ cell 532. Moreover, a pass transistor 545 is connected at a first channel node (source or drain) to the second terminal of $ReMEM_1$ cell 522 and connected at a second channel node (drain or source) to the second terminal of $ReMEM_2$ cell 532. When a gate node of pass transistor 545 is activated (e.g., by a pass wordline coupled to the gate node) the second terminals of $ReMEM_1$ cell 532 and $ReMEM_2$ cell 522 are shorted through pass transistor 545.

Further to the above, PUF segment 814 includes an additional ReMEM cell 730. ReMEM cell 730 can be positioned among elements of PUF segment 814 but is partially or wholly disconnected from differential PUF circuit 340. ReMEM cell 730 can include a first terminal 732 and a second terminal 734, and in the embodiment shown by FIG. 8 is partially connected to differential PUF circuit 340 through a connection between second terminal 734 of ReMEM cell 730 and M5 layer as shown. First terminal 732 can be connected to a segment of M4 metal layer and connected to an external contact 855. In various embodiments, external contact 855 can connect to a portion of diffusion layer 810 outside that shown in FIG. 8. For instance, external contact 855 can connect transistor at a periphery of diffusion layer 810 outside of PUF segment 814 and MTP segment 812. In other embodiments, external contact 855 can be connected to a device or circuit among back-end-of-line layers of semiconductor topology 800 as opposed to diffusion layer 810. In still other embodiments, external contact 855 can be disconnected from additional devices, leaving additional ReMEM cell 730 inert.

Figure 9:
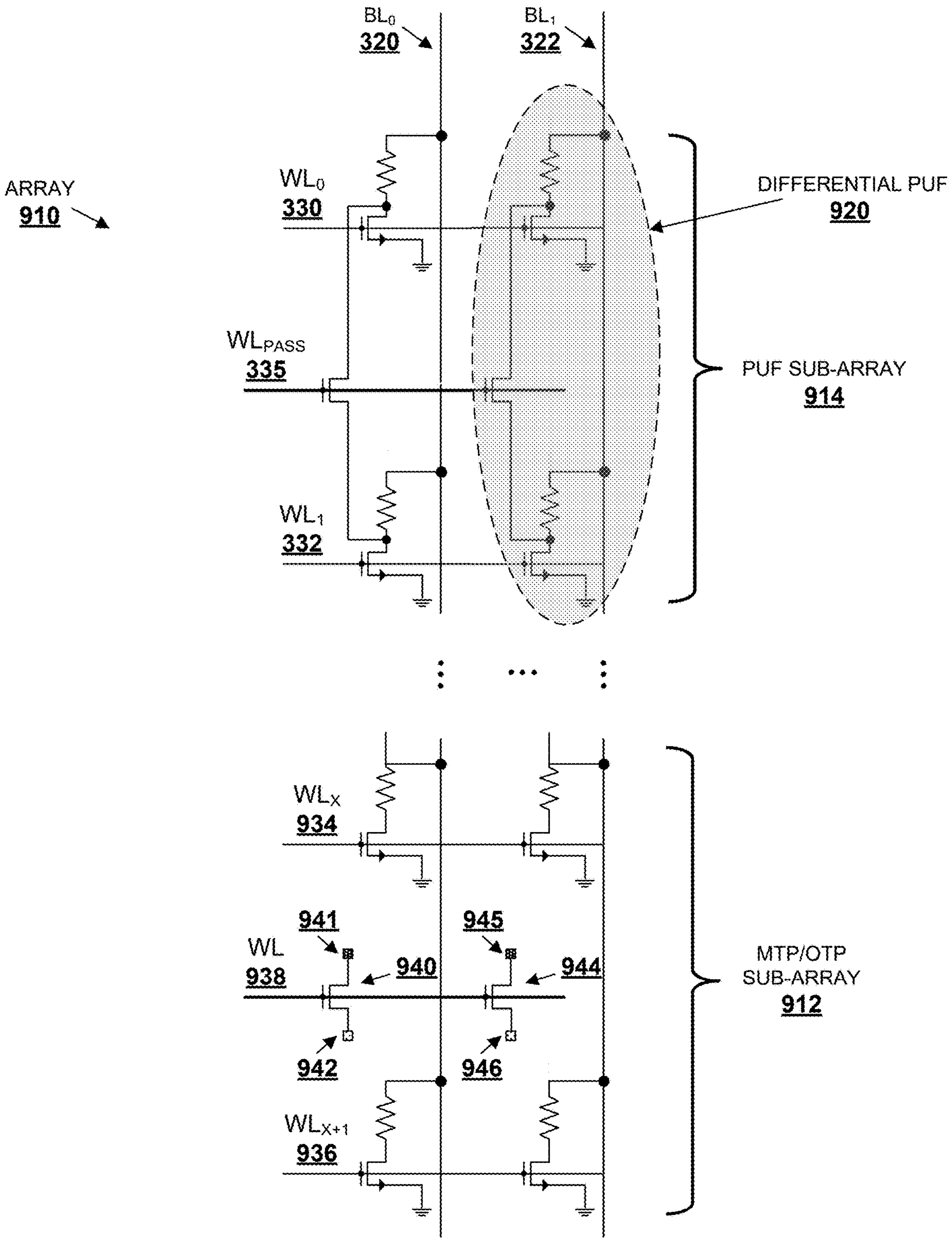
FIG. 9 illustrates a schematic diagram of an example PUF circuit and MTP/OTP circuit on a common bitline with uniform cell pitch according to further embodiments.

FIG. 9 depicts a circuit 900 according to alternative embodiments of the present disclosure. Circuit 900 can comprise a single bitline circuit comprising a PUF sub-array 914 and a MTP/OTP sub-array 912 addressable on a single bitline. PUF sub-array 914 includes a wordline-coupled differential PUF circuit 920 comprising two 1T1R resistive memory cells and a pass transistor selectively coupling second terminals of ReMEM cells of the 1R1R resistive memory cells. MTP/OTP sub-array 912 comprises 1T1R memory circuits with a pass transistor positioned there between. For instance, a pass transistor 940 adjacent $bitline_0$ 320 having a source 941 and drain 942 is shown, and a pass transistor 944 adjacent $bitline_1$ 322 having a source 945 and drain 946 as shown. In various embodiments, source and drain nodes of transistor 940 and transistor 944 can be unconnected from 1T1R circuits of MTP/OTP sub-array 912.

Moreover, an array 910 of ReMEM cells can have a common pitch between respective cells thereof. A pitch between ReMEM cells of PUF sub-array 914 can have a first distance. Likewise, a pitch between ReMEM cells of MTP/OTP sub-array 912 can have a second distance. In various embodiments, the first distance and the second distance can be the same, or substantially the same.

The diagrams included herein are described with respect to several circuits, controllers, and arrays of resistive switching devices or an integrated circuit device(s) comprising multiple circuits, controllers, or arrays. It should be appreciated that such diagrams can include those circuits, controllers, etc., specified therein, some of the specified circuits/controllers/arrays, or additional circuits/controllers/arrays not explicitly depicted but known in the art or reasonably conveyed to those of skill in the art by way of the context provided herein. Components of disclosed integrated circuit devices can also be implemented as sub-components of another disclosed component (e.g., input 140 and output 150 can be sub-components of controller 120), whereas other components disclosed as sub-components can be separate components in various embodiments (e.g., PUF bits 112, OTP bits 114, MTP bits 116 or RNG bits 118 can be embodied in separate arrays as opposed to portions of array(s) 110). Further, embodiments within a particular Figure of the present specification can be applied in part or in whole to other embodiments depicted in other Figures without limitation, subject only to suitability to achieving a disclosed function or purpose as understood by one of skill in the art, and vice versa. As an illustrative (and non-limiting) example, array(s) 110 can be operably coupled with controller 120 as depicted or with controller 120 and some or all array control components of FIG. 11 (e.g., row control 1104, sense amps and write circuits 1108, etc.), or substituted for memory array 1102 of FIG. 11, and so forth. Additionally, it is noted that one or more disclosed processes can be combined into a single process providing aggregate functionality. For instance, a write process can comprise a read-verify process, or vice versa, to facilitate storing data at memory or generating data within memory and reading that stored/generated data, by way of a single process. Components of the disclosed architectures can also interact with one or more other components not specifically described herein but known by those of skill in the art.

Figure 10:
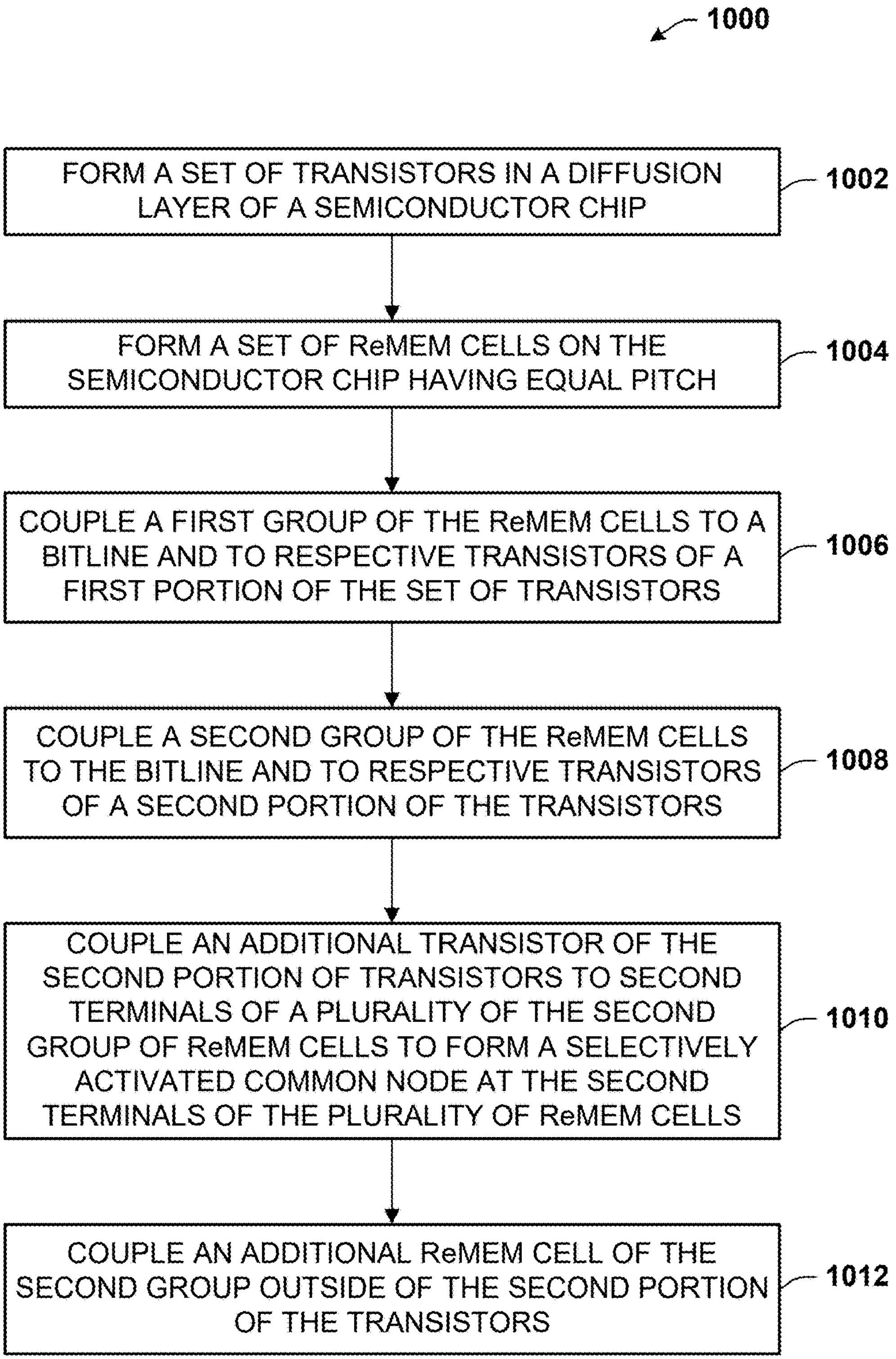
FIG. 10 depicts a flowchart of a sample method for fabricating a memory array utilizing two-terminal resistive switching memory, in additional disclosed embodiments.

In view of the exemplary diagrams described supra, process methods that can be implemented in accordance with the disclosed subject matter will be better appreciated with reference to the flow charts of FIGS. 10 and 11. While for purposes of simplicity of explanation, the methods of FIGS. 10 and 11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein can be implemented as part of a disclosed method within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methods to an electronic device, stored in embedded memory within the electronic device, and so forth. The term article of manufacture, as used, is intended to encompass a computer program accessible from any computer-readable device, device in conjunction with a carrier, or storage medium, or the like.

Referring now to FIG. 10, there is shown a method 1000 for fabricating a semiconductor device according to one or more embodiments of the present disclosure. At 1002, method 1000 can comprise forming a set of transistors in a diffusion layer of a semiconductor chip. At 1004, method 1000 can comprise forming a set of ReMEM cells on the semiconductor chip having equal pitch there between. At 1006, method 1000 can comprise coupling a first group of the ReMEM cells to a bitline and to respective transistors of a first portion of the set of transistors. At 1008, method 1000 can comprise coupling a second group of the ReMEM cells to the bitline and to respective transistors of a second portion of the transistors. At 1010, method 1000 can comprise coupling an additional transistor of the second portion of transistors to second terminals of a plurality of the second group of ReMEM cells to form a selectively activated common node at the second terminals of the plurality of ReMEM cells. In addition, at 1012, method 1000 can comprise coupling an additional ReMEM cell of the second group of ReMEM cells outside of the second portion of the transistors. In various embodiment, the additional ReMEM cell can be coupled to a transistor at a periphery of the second portion of the transistors, or can be connected to a back-end-of-line component above the second portion of the transistors, or can be disconnected.

Turning to FIG. 11, a method for forming a circuit is provided. At 1102, method 1100 can comprise forming a set of transistors in a diffusion layer of a semiconductor chip. At 1104, method 1100 can comprise forming ReMEM cells having equal pitch in a back-end-of-line layer above the set of transistors. At 1106, method 1100 can comprise coupling first terminals of a first group of the ReMEM cells to a bitline and second terminals to respective transistors of a first portion of the set of transistors. At 1108, method 1100 can comprise configuring the first group of the ReMEM cells for MTP or OTP operation.

At 1110, method 1100 can comprise coupling first terminals of a second group of the ReMEM cells to the bitline and second terminals to respective transistors of a second portion of the transistors. At 1112, method 1100 can comprise configuring the second group of the ReMEM cells for differential PUF operation.

At 1114, method 1100 can comprise coupling an additional transistor of the second portion of transistors to second terminals of ReMEM cells of the second group that form a differential PUF circuit. At 1116, method 1100 can optionally comprise coupling a second terminal of an additional ReMEM cell of the second group outside of the second portion of the transistors, or leave the additional ReMEM cell unconnected from the set of transistors.

Example Operating Environments

Figure 12:
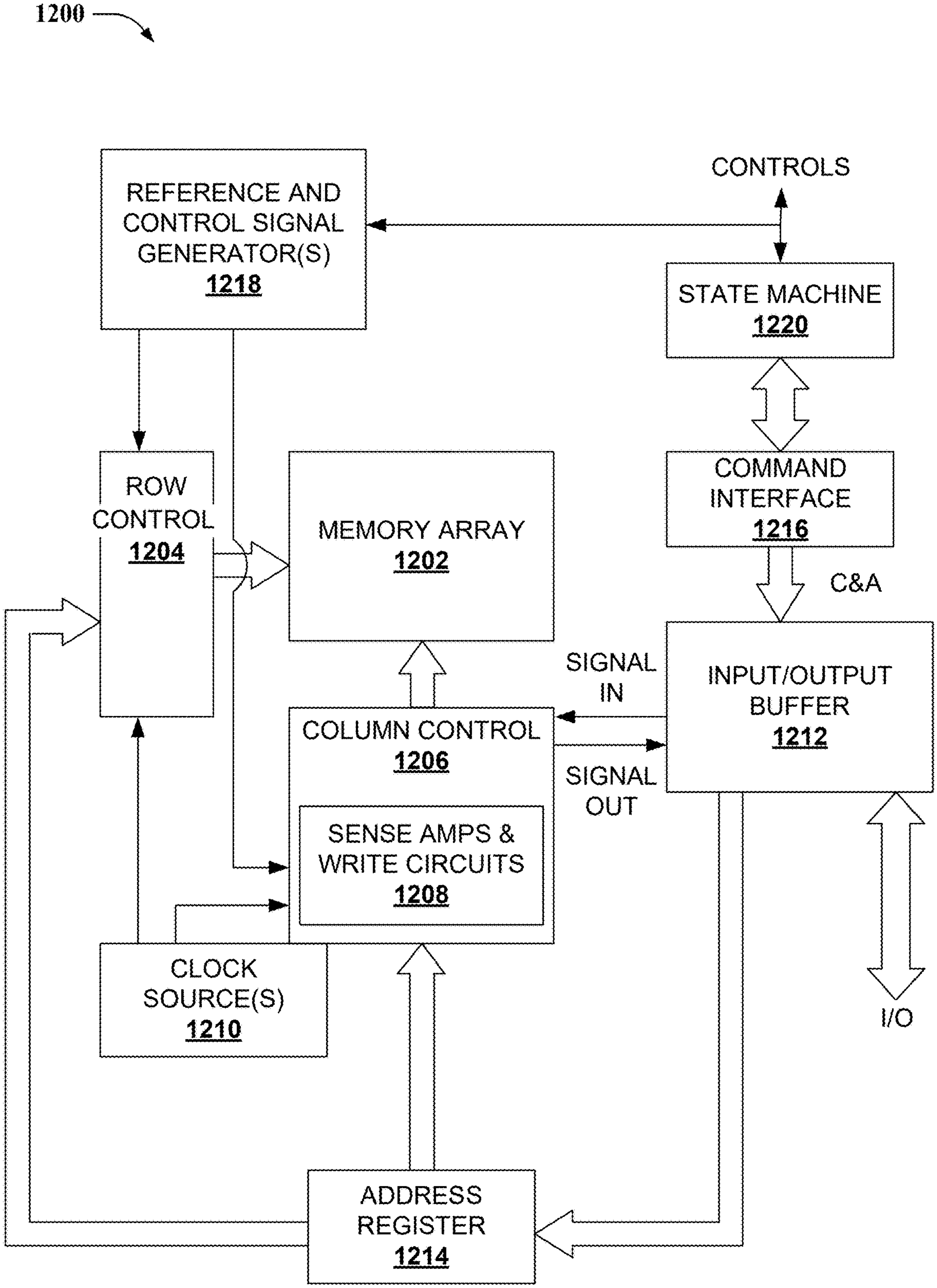
FIG. 12 illustrates a block diagram of an example electronic operating environment in accordance with one or more disclosed embodiments.

FIG. 12 illustrates a block diagram of an example operating and control environment 1200 for a memory array 1202 of a memory device according to aspects of the subject disclosure. Control environment 1200 and memory array 1202 can be formed within a single semiconductor die in some embodiments, although the subject disclosure is not so limited and in other embodiments some components of control environment 1200 can be formed on a separate semiconductor die. In at least one aspect of the subject disclosure, memory array 1202 can comprise memory selected from a variety of memory cell technologies. In at least one embodiment, memory array 1202 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1206 including sense amps and write circuits 1208 can be formed adjacent to memory array 1202. Moreover, column controller 1206 can be configured to activate (or identify for activation) a subset of bit lines of memory array 1202. Column controller 1206 can utilize a control signal(s) provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines of memory array 1202. Also utilizing control signals of reference and control signal generator(s) 1218, row controller 1204 can select one or more rows of memory cells with a suitable selection voltage. Moreover, row controller 1204 can facilitate program, erase or read operations by applying suitable voltages at selected word lines.

Sense amps and write circuits 1208 can read data from and write data to (respectively), the activated memory cells of memory array 1202, which are selected by column control 1206 and row control 1204. Data read out from memory array 1202 can be provided to an input/output buffer 1212. Likewise, data to be written to memory array 1202 can be received from the input/output buffer 1212 and written to the activated memory cells of memory array 1202.

A clock source(s) 1210 can provide respective clock pulses to facilitate timing for read, write, and program operations of row controller 1204 and column controller 1206. Clock source(s) 1210 can further facilitate selection of word lines or bit lines in response to external or internal commands received by operating and control environment 1200. Input/output buffer 1212 can comprise a command and address input, as well as a bidirectional data input and output. Instructions are provided over the command and address input, and the data to be written to memory array 1202 as well as data read from memory array 1202 is conveyed on the bidirectional data input and output, facilitating connection to an external host apparatus, such as a computer or other processing device (not depicted, but see e.g., computer 1302 of FIG. 13, infra).

Input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1214. In addition, input data is transmitted to memory array 1202 via signal input lines between column control 1206 and input/output buffer 1212, and output data is received from memory array 1202 via sense amps (1208) and provided on signal output lines to input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus and determine whether data input to the input/output buffer 1212 is write data, a command, or an address. Input commands can be transferred to a state machine 1220.

State machine 1220 can be configured to manage programming and reprogramming of memory array 1202 (as well as other memory banks of a multi-bank memory array). Instructions provided to state machine 1220 are implemented according to control logic configurations, enabling state machine 1220 to manage read, write, erase, data input, data output, and other functionality associated with memory cell array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1210 or reference and control signal generator(s) 1218. Control of clock source(s) 1210 can cause output pulses configured to facilitate row controller 1204 and column controller 1206 implementing the particular functionality. Output pulses can be transferred to selected bit lines by column controller 1206, for instance, or word lines by row controller 1204, for instance.

Figure 13:
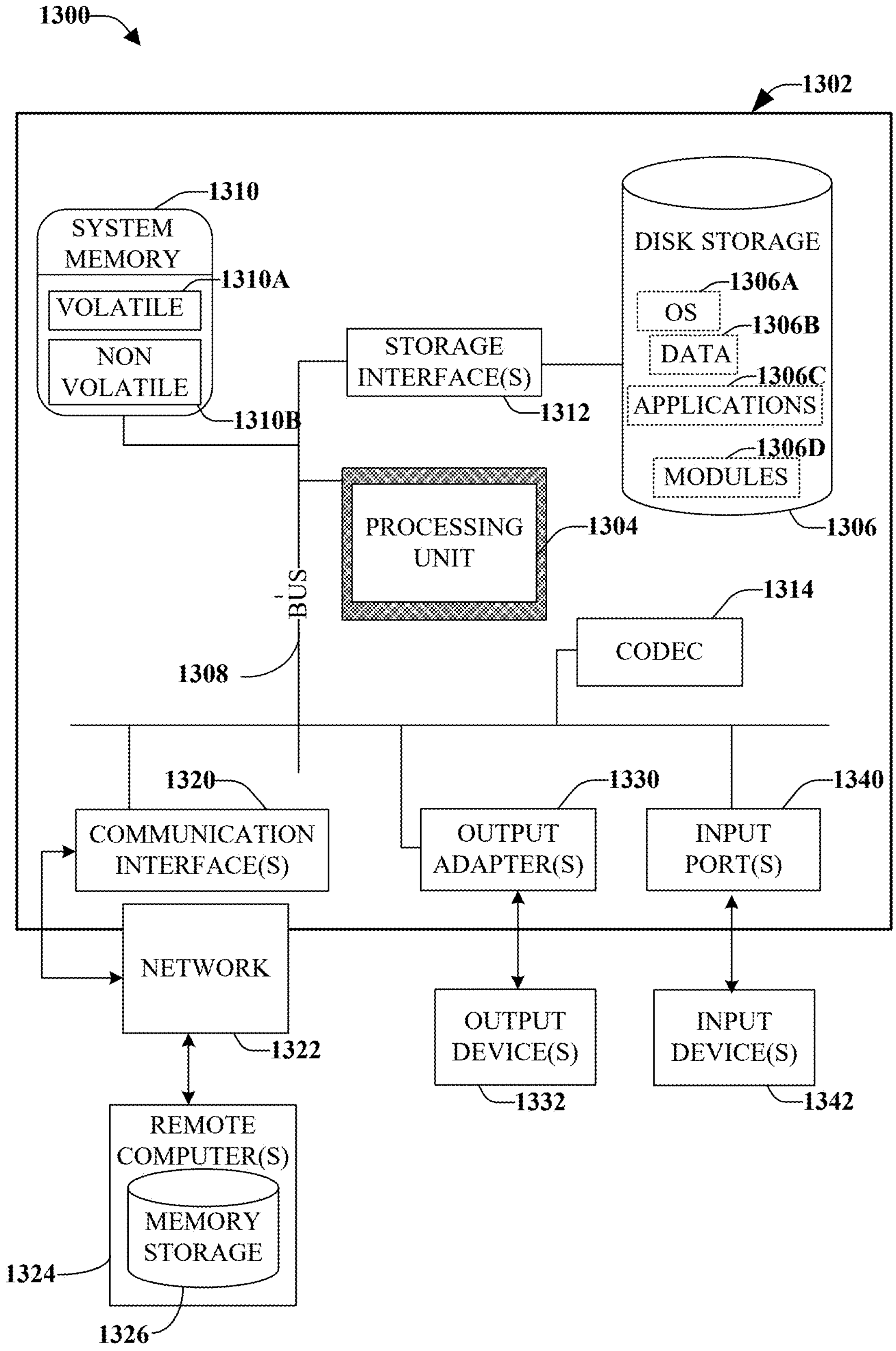
FIG. 13 illustrates a block diagram of an example computing environment for implementing one or more embodiments of the present disclosure.

In connection with FIG. 13, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 13, a suitable environment 1300 for implementing various aspects of the claimed subject matter includes a computer 1302. The computer 1302 includes a processing unit 1304, a system memory 1310, a codec 1314, and a system bus 1308. The system bus 1308 couples system components including, but not limited to, the system memory 1310 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), Small Computer Systems Interface (SCSI), Compute eXpress Link (CXL), high speed Serial Peripheral Interface (SPI) interfaces (e.g., HyperFlash, and so forth), Inter-Integrated Circuit ($I^2C$) communication protocol, $I^3C$ communication protocol, etc.

The system memory 1310 includes volatile memory 1310A and non-volatile memory 1310B. The basic input/output system (BIOS), containing the basic routines to transfer information between elements within the computer 1302, such as during start-up, is stored in non-volatile memory 1310B. In addition, according to present innovations, codec 1314 may include at least one of an encoder or decoder, wherein the at least one of an encoder or decoder may consist of hardware, software, or a combination of hardware and software. Although, codec 1314 is depicted as a separate component, codec 1314 may be contained within non-volatile memory 1310B. By way of illustration, and not limitation, non-volatile memory 1310B can include read only memory (ROM), programmable ROM (PROM), electrically programmable ROM (EPROM), electrically erasable programmable ROM (EEPROM), or flash memory, two-terminal memory, and so on. Volatile memory 1310A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1302 may also include removable/non-removable, volatile/non-volatile computer storage medium. FIG. 13 illustrates, for example, disk storage 1306. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1306 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1306 to the system bus 1308, a removable or non-removable interface is typically used, such as storage interface 1312. It is appreciated that storage devices 1306 can store information related to a user. Such information might be stored at or provided to a server or to an application running on a user device. In one embodiment, the user can be notified (e.g., by way of output device(s) 1332) of the types of information that are stored to disk storage 1306 or transmitted to the server or application. The user can be provided the opportunity to opt-in or opt-out of having such information collected and/or shared with the server or application (e.g., by way of input from input device(s) 1342).

It is to be appreciated that FIG. 13 describes software that acts as an intermediary between users and the basic computer resources described in the suitable operating environment 1300. Such software includes an operating system 1306A. Operating system 1306A, which can be stored on disk storage 1306, acts to control and allocate resources of the computer system 1302. Applications 1306C take advantage of the management of resources by operating system 1306A through program modules 1306D, and program data 1306D, such as the boot/shutdown transaction table and the like, stored either in system memory 1310 or on disk storage 1306. It is to be appreciated that the claimed subject matter can be implemented with various operating systems or combinations of operating systems.

A user enters commands or information into the computer 1302 through input device(s) 1342. Input devices 1342 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via input port(s) 1340. Input port(s) 1340 include, for example, a serial port, a parallel port, a game port, and a universal serial bus (USB). Output device(s) 1332 use some of the same type of ports as input device(s) 1342. Thus, for example, a USB port may be used to provide input to computer 1302 and to output information from computer 1302 to an output device 1332. Output adapter 1330 is provided to illustrate that there are some output devices 1332 like monitors, speakers, and printers, among other output devices 1332, which require special adapters. The output adapters 1330 include, by way of illustration and not limitation, video and sound cards that provide a means of connection between the output device 1332 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1324. The remote computer(s) 1324 can be a personal computer, a server, a router, a network PC, a workstation, a microprocessor-based appliance, a peer device, a smart phone, a tablet, or other network node, and typically includes many of the elements described relative to computer 1302. For purposes of brevity, only a memory storage device 1326 is illustrated with remote computer(s) 1324. Remote computer(s) 1324 is logically connected to computer 1302 through a network 1322 and then connected via communication interface(s) 1320. Network 1322 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1320 refers to the hardware/software employed to connect the network 1322 to the bus 1308. While communication interface(s) 1320 is shown for illustrative clarity inside computer 1302, it can also be external to computer 1302. The hardware/software necessary for connection to the network 1322 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReMEM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, comprising:

an array of transistors;

an array of two-terminal resistive switching memory (ReMEM) cells;

a bitline; wherein:

a first group of transistors of the array of transistors and a first group of ReMEM cells of the array of ReMEM cells form a first plurality of one transistor one resistive memory (1T1R) ReMEM circuits coupled respectively at one end to the bitline and at a second end to ground;

a second group of transistors of the array of transistors and a second group of ReMEM cells of the array of ReMEM cells form a second plurality of 1T1R ReMEM circuits coupled respectively at one end to the bitline and at a second end to ground;

a first wordline coupled to a gate of a first transistor of a first 1T1R ReMEM circuit of the first plurality of 1T1R ReMEM circuits, the first 1T1R ReMEM circuit comprising the first transistor and a first two-terminal ReMEM of the first group of ReMEM cells;

a second wordline coupled to a second gate of a second transistor of a second 1T1R ReMEM circuit of the first plurality of 1T1R ReMEM circuits, the second 1T1R ReMEM circuit comprising the second transistor and a second two-terminal ReMEM of the first group of ReMEM cells;

a pass transistor of the first group of transistors that is:

coupled at a source node of the pass transistor to a first common node electrically coupling a second terminal of the first two-terminal ReMEM with a channel node of the first transistor;

coupled at a drain node of the pass transistor to a second common node electrically coupling a second terminal of the second two-terminal ReMEM with a second channel node of the second transistor; and a pass wordline coupled to a gate node of the pass transistor, wherein activation of the pass wordline electrically shorts the first common node and the second common node through the pass transistor.

2. The integrated circuit device of claim 1, further comprising a third two-terminal ReMEM of the first group of ReMEM cells positioned within the array of ReMEM cells between the first two-terminal ReMEM and the second two-terminal ReMEM, and further wherein the pass transistor is positioned within the array of transistors between the first transistor and the second transistor.

3. The integrated circuit device of claim 2, wherein the first group of ReMEM cells has a common or a substantially common pitch between each of: the first two-terminal ReMEM, the second two-terminal ReMEM and the third two-terminal ReMEM.

4. The integrated circuit device of claim 3, wherein the second group of ReMEM cells has the common or the substantially common pitch between respective two-terminal ReMEM cells of the second group of ReMEM cells.

5. The integrated circuit device of claim 2, wherein the third two-terminal ReMEM is electrically uncoupled from the first group of transistors and from the second group of transistors.

6. The integrated circuit device of claim 1, further comprising a third 1T1R ReMEM circuit of the second plurality of 1T1R ReMEM circuits and a fourth 1T1R ReMEM circuit of the second plurality of 1T1R ReMEM circuits, wherein:

the third 1T1R ReMEM circuit comprises a third transistor of the second group of transistors and a third two-terminal ReMEM of the second group of ReMEM cells;

the fourth 1T1R ReMEM circuit comprises a fourth transistor of the second group of transistors and a fourth two-terminal ReMEM of the second group of ReMEM cells;

a third wordline coupled to a gate of the third transistor;

a fourth wordline coupled to a gate of the fourth transistor;

a second pass transistor positioned within the array of transistors between the third transistor and the fourth transistor; and a second pass wordline coupled to a gate node of the second pass transistor.

7. The integrated circuit device of claim 6, wherein a first distance between the first two-terminal ReMEM and the second two-terminal ReMEM within the first group of ReMEM cells is defined by a first pitch, and wherein a second distance between the third two-terminal ReMEM and the fourth two-terminal ReMEM within the second group of ReMEM cells is defined by a second pitch, and further wherein the first distance and first pitch are the same or substantially the same as the second distance and second pitch.

8. The integrated circuit device of claim 6, wherein the second pass transistor is electrically uncoupled from the first group of ReMEM cells and from the second group of ReMEM cells.

9. The integrated circuit device of claim 1, wherein the first 1T1R ReMEM circuit, the first wordline, the second 1T1R ReMEM circuit, the second wordline, the pass transistor and the pass wordline form a wordline-coupled differential physical unclonable function (PUF) circuit on the bitline.

10. The integrated circuit device of claim 9, wherein a third 1T1R ReMEM circuit of the second plurality of 1T1R ReMEM circuits is one of:

a many-time programmable (MTP) non-volatile memory circuit on the bitline; or a one-time programmable (OTP) non-volatile memory circuit on the bitline.

11. A semiconductor chip, comprising:

an array of transistors formed in a diffusion layer of the semiconductor chip;

an array of two-terminal memory cells overlying the diffusion layer and overlying at least a portion of the array of transistors;

a bitline;

a first group of wordlines;

a first 1T1R ReMEM circuit comprising a first transistor of the array of transistors and a first two-terminal memory cell of the array of two-terminal memory cells;

a second 1T1R ReMEM circuit comprising a second transistor of the array of transistors and a second two-terminal memory cell of the array of two-terminal memory cells, wherein the first and second 1T1R ReMEM circuits are coupled to respective wordlines of the first group of wordlines and form a differential programmed physical unclonable feature (PUF) non-volatile memory circuit coupled to the bitline;

a second group of wordlines;

a third 1T1R ReMEM circuit comprising a third transistor coupled to a third wordline of the second group of wordlines; and a fourth 1T1R ReMEM circuit comprising a fourth transistor coupled to a fourth wordline of the second group of wordlines, wherein:

the third 1T1R ReMEM circuit or the fourth 1T1R ReMEM circuit forms a many-time programmable non-volatile memory circuit or a one-time programmable non-volatile memory circuit coupled to the bitline; wherein the first group of wordlines further comprises a pass wordline coupled to a gate of a pass transistor, wherein a drain node of the pass transistor is coupled to a common node connecting the first transistor with the first two-terminal memory cell and a source node of the pass transistor is coupled to a second common node connecting the second transistor with the second two-terminal memory cell, and wherein activation of the pass transistor by the pass wordline electrically couples the common node to the second common node through the pass transistor.

12. The semiconductor chip of claim 11, further comprising a third two-terminal memory cell positioned within the array of two-terminal memory cells between the first two-terminal memory cell and the second two-terminal memory cell.

13. The semiconductor chip of claim 12, wherein a pitch between the first two-terminal memory cell and the third two-terminal memory cell or between the second two-terminal memory cell and the third two-terminal memory cell is equal to or substantially equal to a second pitch between a third two-terminal memory cell of the third 1T1R ReMEM circuit and a fourth two-terminal memory cell of the fourth 1T1R ReMEM circuit.

14. The semiconductor chip of claim 12, further comprising a second array of transistors comprising a perimeter transistor formed within the diffusion layer at a perimeter of the array of transistors.

15. The semiconductor chip of claim 14, wherein the third two-terminal memory cell is coupled to the perimeter transistor and is electrically uncoupled from the array of transistors.

16. The semiconductor chip of claim 11, wherein the second group of wordlines further comprises a second pass wordline coupled to a gate of a second pass transistor, wherein the second pass transistor is located within the array of transistors between the third transistor and the fourth transistor.

17. The semiconductor chip of claim 16, wherein a pitch between the first two-terminal memory cell and the second two-terminal memory cell is equal to or substantially equal to a second pitch between a third two-terminal memory cell of the third 1T1R ReMEM circuit and a fourth two-terminal memory cell of the fourth 1T1R ReMEM circuit.

18. The semiconductor chip of claim 16, wherein the second pass transistor is electrically unconnected from the array of two-terminal memory cells.

19. A method of fabricating a memory array of an integrated circuit, comprising:

forming a set of transistors in a diffusion layer of a substrate;

forming a set of resistive memory cells (ReMEM cells) at least in part overlying the set of transistors and the diffusion layer, wherein a first group of the ReMEM cells in a first portion of the set of ReMEM cells has a first intercell pitch and a second group of the ReMEM cells in a second portion of the set of ReMEM cells has a second intercell pitch equal to or substantially equal to the first intercell pitch;

coupling first terminals of a first group of the ReMEM cells to a bitline and respective second terminals of the first group of ReMEM cells to respective transistors of a first portion of the set of transistors;

configure the first group of the ReMEM cells for many-time program (MTP) or one-time program (OTP) operation;

couple a first terminal of a first ReMEM cell of a second group of the ReMEM cells to the bitline and a second terminal of the first ReMEM cell to a first transistor of a second portion of the set of transistors to form a first 1T1R memory circuit;

couple a first terminal of a second ReMEM cell of the second group of the ReMEM cells to the bitline and a second terminal of the second ReMEM cell to a second transistor of the second portion of the set of transistors to form a second 1T1R memory circuit; and configure the second group of the ReMEM cells for differential physical unclonable function (PUF) operation, further comprising:

couple the first ReMEM cell and the second ReMEM cell to a pass transistor, comprising coupling a drain node of the pass transistor to a common node connecting the first ReMEM cell to the first transistor of the first 1T1R memory circuit, and coupling a source node of the pass transistor to a second common node connecting the second ReMEM cell to the second transistor of the second 1T1R memory circuit, and couple a pass wordline to a gate node of the pass transistor.

* * * * *